United States Patent
Zhang et al.

(10) Patent No.: US 12,419,134 B2
(45) Date of Patent: Sep. 16, 2025

(54) SOLAR CELL, METHOD FOR PREPARING SOLAR CELL, AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Xiaowen Zhang, Zhejiang (CN); Ding Yu, Zhejiang (CN); Xiangyun Zhao, Zhejiang (CN); Jialei Chai, Zhejiang (CN); Wenqi Li, Zhejiang (CN); Jie Yang, Zhejiang (CN); Peiting Zheng, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 18/615,980

(22) Filed: Mar. 25, 2024

(65) Prior Publication Data
US 2025/0212551 A1    Jun. 26, 2025

(30) Foreign Application Priority Data
Dec. 26, 2023    (CN) .................... 202311814343.7

(51) Int. Cl.
*H10F 77/166* (2025.01)
*H10F 71/00* (2025.01)
(Continued)

(52) U.S. Cl.
CPC ....... *H10F 77/1662* (2025.01); *H10F 71/103* (2025.01); *H10F 71/129* (2025.01); *H10F 77/215* (2025.01); *H10F 77/311* (2025.01)

(58) Field of Classification Search
None
See application file for complete search history.

(56) References Cited

U.S. PATENT DOCUMENTS

2022/0158003 A1    5/2022    Jin et al.

FOREIGN PATENT DOCUMENTS

| CN | 110752261 A | 2/2020 |
| CN | 114613865 A | 6/2022 |

(Continued)

OTHER PUBLICATIONS

Zhejiang Jinko Solar Co., Ltd., et al., Extended European Search Report, EP 24163745.3, Sep. 16, 2024, 61 pgs.

*Primary Examiner* — Eli S Mekhlin
(74) *Attorney, Agent, or Firm* — USCH Law, PC

(57) ABSTRACT

A solar cell is provided, including: a substrate having a first surface including first regions and second regions, a first passivation contact structure formed on the first and second regions, second passivation contact structures formed on the first passivation contact structure, first passivation films formed on the first passivation contact structure, and first electrodes extending in a second direction perpendicular to the first direction. Each second passivation contact structure has an orthographic projection on the first surface in a respective first region, and each first passivation film has an orthographic projection on the first surface in a respective second region. Each first electrode covers a top surface of a respective second passivation contact structure and at least part of two opposing sidewalls of the respective second passivation contact structure in the first direction, and is in electrical contact with the respective second passivation contact structure.

20 Claims, 10 Drawing Sheets

(51) Int. Cl.
*H10F 71/10* (2025.01)
*H10F 77/20* (2025.01)
*H10F 77/30* (2025.01)

(56) References Cited

FOREIGN PATENT DOCUMENTS

| | | |
|---|---|---|
| CN | 115810688 A | 3/2023 |
| CN | 115985980 A | 4/2023 |
| CN | 116565052 A | 8/2023 |
| WO | 2017004624 A1 | 1/2017 |

SOLAR CELL, METHOD FOR PREPARING SOLAR CELL, AND PHOTOVOLTAIC MODULE

CROSS-REFERENCE TO RELATED APPLICATION

The present disclosure claims the benefit of priority under the Paris Convention to Chinese Patent Application 202311814343.7 filed on Dec. 26, 2023, which is incorporated herein by reference in its entirety.

TECHNICAL FIELD

Embodiments of the present disclosure relate in general to the field of solar cells, and more specifically to a solar cell, a method for preparing a solar cell and a photovoltaic module.

BACKGROUND

Solar cells have good photovoltaic conversion capabilities. In tunnel oxide passivating contacts (TOPCON) cells, a passivation contact structure is prepared on one of the surfaces of the substrate for inhibiting carrier recombination on the surface of the substrate in the solar cell and providing good conductivity for majority carriers.

Electrodes are also formed in the solar cell in order to transport and collect the generated carriers. The electrodes are in electrical contact with the passivated contact structure to collect the carriers. The ability of the electrodes to collect the carriers is critical to photovoltaic conversion performance of the solar cell.

However, conventional solar cells have low photoelectric conversion efficiency.

SUMMARY

Some embodiments of the present disclosure provide a solar cell and a photovoltaic module, which are at least conducive to photoelectric conversion efficiency of the solar cell.

Some embodiments of the present disclosure provide a solar cell, including: a substrate having a first surface, where the first surface includes first regions and second regions alternatingly arranged in a first direction; a first passivation contact structure formed on the first regions and the second regions; second passivation contact structures formed on the first passivation contact structure, the second passivation contact structures including at least one respective second passivation contact structure corresponding to a respective first region of the first regions, where each of the at least one respective second passivation contact structure has an orthographic projection on the first surface in the respective first region; first passivation films formed on the first passivation contact structure, where each of the first passivation films has an orthographic projection on the first surface in a respective one of the second regions; and first electrodes extending in a second direction perpendicular to the first direction, where the first electrodes include a respective first electrode formed over the at least one respective second passivation contact structure, the respective first electrode covers a top surface and at least part of two opposing sidewalls of each of the at least one respective second passivation contact structure in the first direction, and is in electrical contact with the at least one respective second passivation contact structure.

In some embodiments, the respective first electrode includes a plurality of conductive extensions, and the plurality of conductive extensions include: first conductive extensions, where the first conductive extensions penetrate each of the at least one respective second passivation contact structure to extend into the first passivation contact structure; and second conductive extensions extending into each of the at least one respective second passivation contact structure.

In some embodiments, the first passivation contact structure includes a first tunneling layer and a first doped conductive layer stacked in a direction away from the substrate, and the first conductive extensions extend into a partial thickness of the first doped conductive layer.

In some embodiments, the second conductive extensions include: first conductive sub-extensions extending into each of the at least one respective second passivation contact structure from the top surface of each of the at least one respective second passivation contact structure; second conductive sub-extensions extending into each of the at least one respective second passivation contact structure from the two opposing sidewalls of each of the at least one respective second passivation contact structure.

In some embodiments, each of the at least one respective second passivation contact structure includes a second tunneling layer, a second doped conductive layer and an amorphous silicon layer stacked in a direction away from the substrate, and where the first conductive sub-extensions include: a first plurality of first conductive sub-extensions extending into the amorphous silicon layer; and a second plurality of first conductive sub-extensions extending into the second doped conductive layer.

In some embodiments, the respective first electrode further includes: a glass frit layer covering the top surface and the at least part of two opposing sidewalls of each of the at least one respective second passivation contact structure, where the plurality of conductive extensions are formed in the glass frit layer and extend from the glass frit layer to each of the at least one respective second passivation contact structure; and a slurry body layer formed on the glass frit layer, where the slurry body layer includes a material of the plurality of conductive extensions.

In some embodiments, the respective first electrode covers two opposing sidewalls of each of the at least one respective second passivation contact structure in the first direction and a portion of a top surface of the first passivation contact structure, and the first passivation films include a respective first passivation film having a sidewall facing the at least one respective second passivation contact structure and in contact with a portion of the respective first electrode formed on the two opposing sidewalls of each of the at least one respective second passivation contact structure.

In some embodiments, the respective first electrode includes a plurality of conductive extensions, and the plurality of conductive extensions include: third conductive extensions, where the third conductive extensions extend from the top surface of the first passivation contact structure into a partial thickness of the first passivation contact structure to be in electrical contact with the first passivation contact structure.

In some embodiments, the respective first electrode covers a part of two opposing sidewalls of each of the at least one respective second passivation contact structure, and a portion of the respective first electrode covering the part of two opposing sidewalls of each of the at least one respective second passivation contact structure is formed between two adjacent first passivation films.

In some embodiments, the first passivation contact structure includes a first tunneling layer and a first doped conductive layer stacked in a direction away from the substrate, and each of the at least one respective second passivation contact structure includes a second tunneling layer, a second doped conductive layer, and an amorphous silicon layer stacked in the direction away from the substrate; and where the first doped conductive layer has a thickness that is less than a thickness of the second doped conductive layer.

In some embodiments, the first doped conductive layer has a material including at least one of amorphous silicon, polysilicon, and silicon carbide, and the second doped conductive layer has a material including at least one of amorphous silicon, polysilicon and silicon carbide.

In some embodiments, the second passivation contact structures are arranged at intervals in the first direction, and each of the second passivation contact structures extends in the second direction.

In some embodiments, the second passivation contact structures are arranged at intervals in both the first direction and the second direction.

Some embodiments of the present disclosure provide a method for preparing solar cell, including: providing a substrate having a first surface, where the first surface includes first regions and second regions alternatingly arranged in a first direction; forming a first passivation contact structure on the first regions and the second regions; forming second passivation contact structures on the first passivation contact structure, the second passivation contact structures including at least one respective second passivation contact structure corresponding to a respective first region of the first regions, where each of the at least one respective second passivation contact structure has an orthographic projection on the first surface in the respective first region; forming first passivation films on the first passivation contact structure, where each of the first passivation films has an orthographic projection on the first surface in a respective one of the second regions; and forming first electrodes extending in a second direction perpendicular to the first direction, where the first electrodes include a respective first electrode formed over the at least one respective second passivation contact structure, the respective first electrode covers a top surface and at least part of two opposing sidewalls of each of the at least one respective second passivation contact structure in the first direction, and is in electrical contact with the at least one respective second passivation contact structure.

Some embodiments of the present disclosure further provide a photovoltaic module including: at least one cell string each formed by connecting a plurality of solar cells according to any one of the above embodiments through at least one connecting member; at least one encapsulation layer each configured to cover a surface of a respective cell string; and at least one cover plate each configured to cover a surface of a respective encapsulating adhesive film facing away from the respective cell string.

BRIEF DESCRIPTION OF THE DRAWINGS

One or more embodiments are exemplified with respect to the accompanying drawings to which they correspond. The exemplary description does not constitute limitations on the embodiments, and the figures in the accompanying drawings do not constitute a proportion limitation unless otherwise stated.

DETAILED DESCRIPTION OF THE EMBODIMENTS

Figure 1:
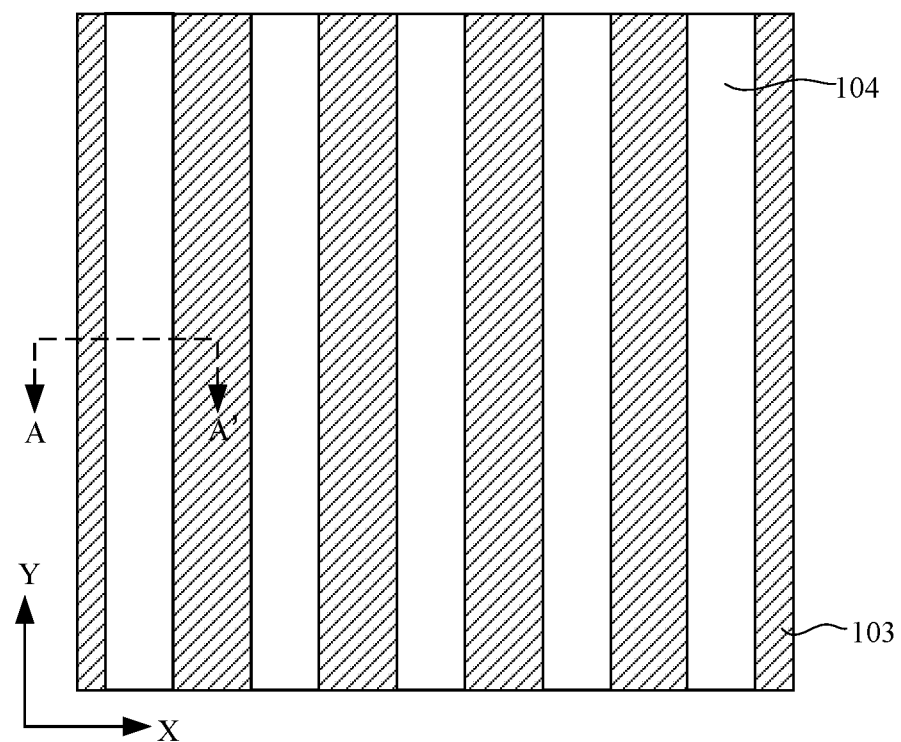
FIG. 1 is a schematic top view of a solar cell according to an embodiment of the present disclosure.

As used herein, features (e.g., regions, structures, devices) described as 'adjacent' to each other indicate and include one or more features having reference numerals which are most adjacent (e.g., closest) to each other. One or more additional features (e.g., additional regions, additional structures, additional devices) having reference numerals that do not match the "adjacent" features may be disposed between the "adjacent" features. In other words, the "adjacent" features may be considered as features directly adjacent to each other such that no other features positioned between the "adjacent" features, or the "adjacent" features may be considered as features indirectly adjacent to each other such that at least one feature having a reference numeral different from reference numerals of features associated with at least one "adjacent" feature is positioned between the "adjacent" features. Thus, features described as 'vertically adjacent' to each other indicate and include one or more features having reference numerals which are most vertically adjacent (e.g., vertically closest) to each other. In addition, features described as 'horizontally adjacent' to each other indicate and include one or more features having reference numerals which are most horizontally adjacent (e.g., horizontally closest) to each other.

In the following description, a second component being formed or disposed over or on a first component, or the second component being formed or disposed over/on a surface of the first component, or the second component being formed or disposed over/on one side of the first component includes that the first component and the second component are in direct contact or an additional component is disposed between the first component and the second component such that the first component and the second component are not in direct contact. The various components may be arbitrarily drawn in different proportions for simplicity and clarity. In the accompanying drawings, some layers/components may be omitted for simplicity.

Unless otherwise stated, a second component being formed or disposed directly on the surface of the first component means that the first component is in direct contact with the second component.

The foregoing "component" may refer to a layer, a film, a region, a portion, a structure, or the like.

When a certain part "includes" another part throughout the specification, other parts are not excluded unless otherwise stated, and other parts may be further included.

In the drawings, thicknesses and areas of layers have been enlarged for better understanding and ease of description. When it is described that a part is "generally" formed on another part, it means the part is not formed on the entire surface (or front surface) of another part and is also not formed in part of the edge of the entire surface.

The terminology used in the description of the various described embodiments herein is for the purpose of describing embodiments only and is not intended to be limiting. As used in the description of the various described embodiments and the appended claims, the singular forms "a", "an" and "the" are intended to include the plural forms as well, unless the context clearly indicates otherwise.

It can be seen from Background that the conventional solar cells have low photoelectric conversion efficiency.

One of the reasons for the low photoelectric conversion efficiency of the conventional solar cells is that, in related technologies, the passivation contact structure of the solar cell, although capable of inhibiting carrier recombination on the surface of the substrate in the solar cell and providing good conductivity for the majority carriers, produces more parasitic absorption of incident light, resulting in a lower utilization rate of the solar cell for incident light. In order to reduce the parasitic absorption of the incident light by the passivation contact structure in the solar cell, the passivation contact structure is provided at a position corresponding to electrodes to form a local passivation contact structure, and the local passivation contact structure is in electrical contact with the electrodes. However, due to a small area of the local passivation contact structure, the contact with the electrodes is limited, and the ability of the electrodes to collect current needs to be further improved.

Embodiments of the present disclosure provide a solar cell including a first passivation contact structure formed on first regions and second regions of a first surface of a substrate, playing a role of passivating and providing a carrier tunneling channel for the first regions and the second regions, second passivation contact structures aligned with the first regions, and first electrodes each covering a top surface and at least part of two opposing sidewalls of a respective second passivation contact structure. Compared with the first electrode formed only on the top surface of the second passivation contact structure, a contact area between the first electrode and the second passivation contact structure is increased and an electrical contact performance between the first electrode and the second passivation contact structure is enhanced, which is conducive to collection of carriers by the first electrode, thereby improving the photoelectric conversion efficiency of the solar cell. The second passivation contact structures are formed on portions of the first passivation contact structure aligned with the second regions, i.e., there is only the first passivation contact structure on the second regions of the first surface, which can reduce parasitic absorption of incident light by the second passivation contact structures.

The first passivation contact structure and second passivation contact structures are formed between the first electrodes and the substrate and have relatively large thicknesses, which prevents the slurry for forming the first electrodes from penetrating the first passivation contact structure to be in contact with the substrate during preparing the first electrodes. Moreover, because there is the first passivation contact structure underneath the second passivation contact structures, the slurry used to form portions of the first electrodes on the two opposing sidewalls of the second passivation contact structure would not directly contact the substrate even if it permeates too much, but permeates into the first passivation contact structure first. In this way, on the one hand, the current collection ability of the first electrode is enhanced to improve the photoelectric conversion efficiency of the solar cell, and on the other hand, direct contacts between the first electrodes and the substrate are avoided.

The following describes embodiments of the present disclosure in detail with reference to the accompanying drawings. A person of ordinary skill in the art may understand that, in the embodiments of the present disclosure, many technical details are provided to make the reader better understand the present disclosure. However, even without these technical details and various changes and modifications based on the following embodiments, the technical solutions claimed in the present disclosure may also be implemented.

Figure 2:
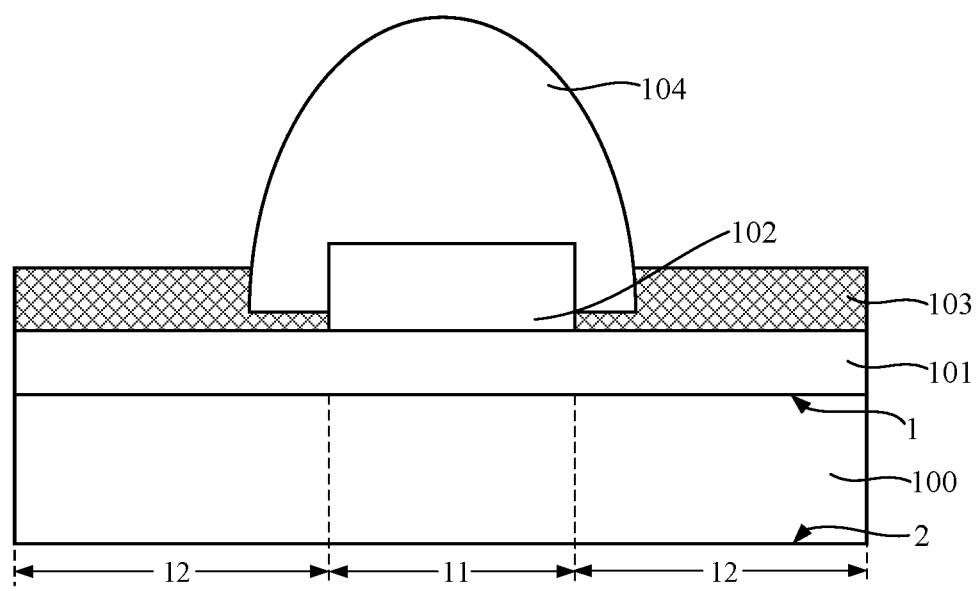
FIG. 2 is a schematic cross-sectional structural diagram of a first solar cell according to an embodiment of the present disclosure.
Figure 3:
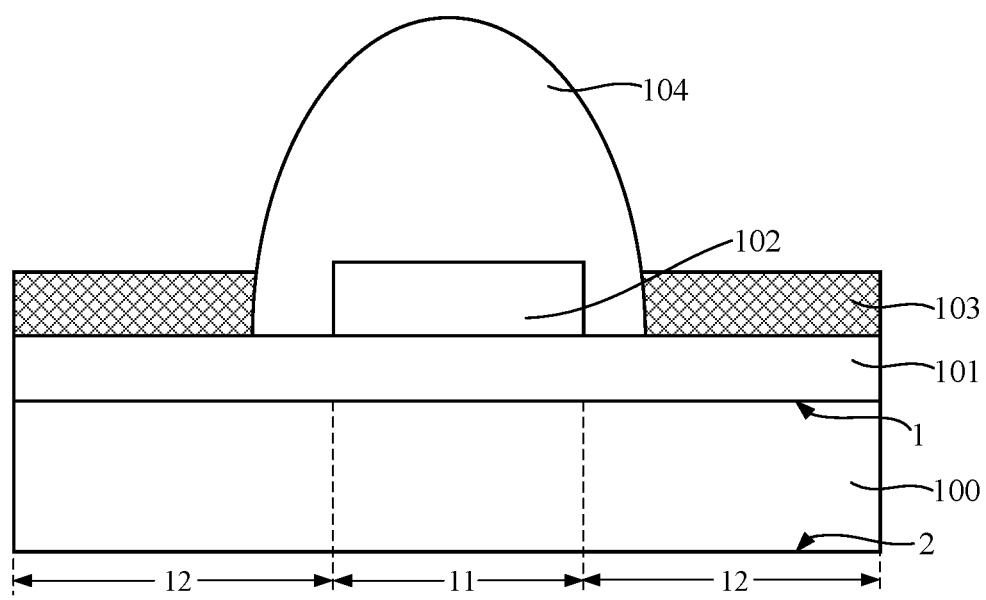
FIG. 3 is a schematic cross-sectional structural diagram of a second solar cell according to an embodiment of the present disclosure.
Figure 4:
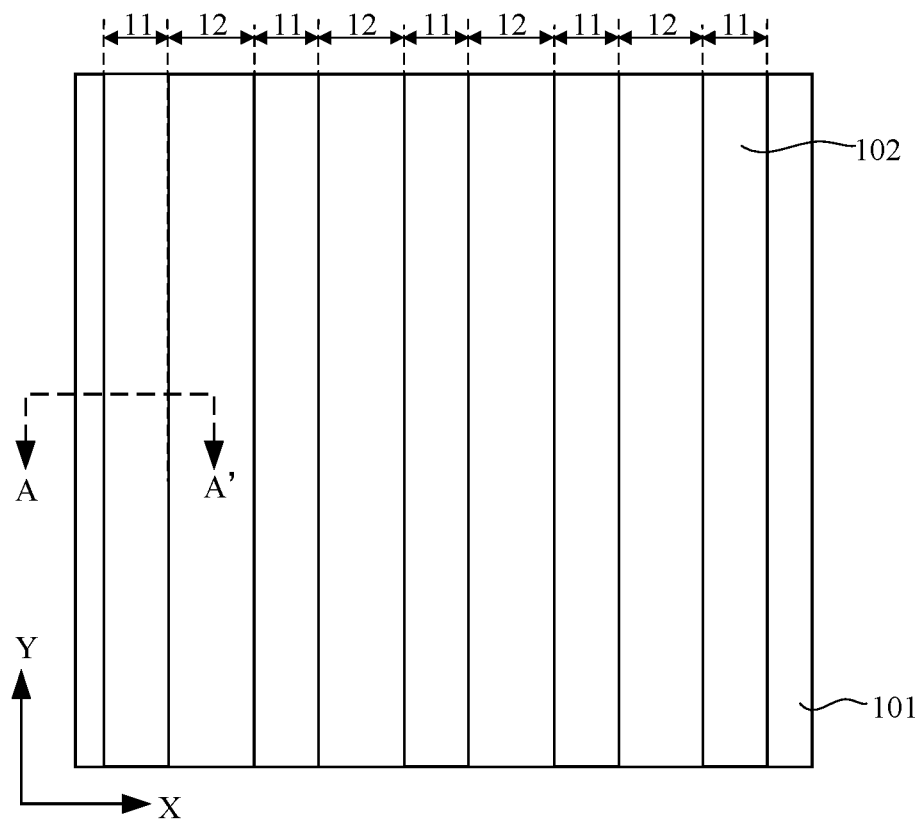
FIG. 4 is a schematic top view of a substrate of a solar cell according to an embodiment of the present disclosure.

FIG. 1 is a schematic top view of a solar cell according to an embodiment of the present disclosure. FIG. 2 is a schematic cross-sectional structural diagram of a first solar cell according to an embodiment of the present disclosure. FIG. 3 is a schematic cross-sectional structural diagram of a second solar cell according to an embodiment of the present disclosure. FIG. 4 is a schematic top view of a substrate in a solar cell according to an embodiment of the present disclosure. FIG. 2 and FIG. 3 are schematic cross-sectional structural diagrams of the solar cell in FIG. 1 along line AA'.

Referring to FIG. 1 to FIG. 4, a solar cell includes a substrate 100 having a first surface 1, and the first surface 1 includes first regions 11 and second regions 12 alternatingly arranged in a first direction X. The solar cell further includes a first passivation contact structure 101 formed on the first regions 11 and the second regions 12, second passivation contact structures 102 formed on the first passivation contact structure 101, first passivation films 103 formed on the first passivation contact structure 101, and first electrodes 104 extending in a second direction Y perpendicular to the first direction X. An orthographic projection of a respective second passivation contact structure 102 on the first surface 1 is in a respective first region 11, and an orthographic projection of a respective first passivation film 103 on the first surface 1 is in a respective second region 12. Each of the first electrodes 104 covers a top surface of the second passivation contact structure 102 and at least part of two opposing sidewalls of the second passivation contact structure 102 in the first direction X, and is in electrical contact with the second passivation contact structure 102.

The first passivation contact structure 101 is formed on the first regions 11 and the second regions 12 of the first surface 1, so as to passivate the first regions 11 and the second regions 12 and provide a carrier tunneling channel for the first regions 11 and the second regions 12, which can inhibit carrier recombination on the first surface 1 of the substrate 100 and provide good conductivity for carriers.

An orthographic projection of a second passivation contact structure 102 on the first surface 1 is in a first region 11, i.e., the second passivation contact structure 102 is aligned with the first region 11 and not aligned with the second region 12, so as to form a local passivation contact structure, which reduces the parasitic absorption of the incident light by the second passivation contact structure 102, and improves the utilization rate of the incident light by the solar cell.

Each first electrode 104 covers the top surface and at least part of two opposing sidewalls of the second passivation contact structure 102, which, compared with the first electrode 104 formed only on the top surface of the second passivation contact structure 102, increases a contact area between the first electrode 104 and the second passivation contact structure 102, and enhances electrical contact performance of the first electrode 104 and the second passivation contact structure 102, so that improves transport efficiency of carriers, and facilitates collection of carriers by the first electrode 104, thereby improving the photoelectric conversion efficiency of the solar cell.

The first passivation contact structure 101 and the second passivation contact structures 102 are formed between the first electrodes 104 and the substrate 100, and an overall thickness of the first passivation contact structure 101 and the second passivation contact structures 102 is large, so that the slurry for forming the first electrodes 104 can be prevented from permeating the first passivation contact structure 101 to be in contact with the substrate 100 in an actual operation of preparing the first electrode 104, which helps to avoid a low open-circuit voltage of the solar cell due to carrier recombination centers generated by the first electrode 104 being in direct contact with the substrate 100.

In addition, since the first passivation contact structure 101 is formed underneath the second passivation contact structure 102, the portion of the first electrode 104 formed on the two opposing sidewalls of the second passivation contact structure 102 is not easily in direct contact with the substrate 100, but first penetrates the first passivation contact structure 101.

The first passivation film 103 is formed on the first passivation contact structure 101. On the one hand, the first passivation film 103 has a good passivation effect on the first surface 1, has good chemical passivation on dangling bonds of the first surface 1, reduces defect state density of the first surface 1, and inhibits carrier recombination of the first surface 1. On the other hand, the first passivation film 103 also has a good antireflection effect on the incident light, i.e., the reflection of the incident light by the solar cell is reduced, and the utilization rate of the incident light is improved.

In some embodiments, the first passivation film 103 may be a single-layer structure. In some embodiments, the first passivation film 103 may be a multi-layer structure. In some embodiments, a material of the first passivation film 103 includes at least one of silicon oxide, aluminum oxide, silicon nitride, or silicon oxynitride. For example, the first passivation film 103 is a double-layer structure, including a silicon oxide layer and an aluminum oxide layer that are stacked, or a silicon nitride layer and an aluminum oxide layer that are stacked, etc.

In conclusion, the solar cell provided in the embodiments of the present disclosure not only enhances the current collection capability of the first electrode 104 to improve the photoelectric conversion efficiency of the solar cell, but also avoids the problem that the first electrode 104 is in direct contact with the substrate 100 while reducing the parasitic absorption of the incident light and ensuring a higher light utilization rate of the solar cell.

Referring to FIG. 4, in some embodiments, a plurality of first regions 11 and second regions 12 are provided. The second passivation contact structures 102 are aligned with the first regions 11, i.e., a plurality of second passivation contact structures 102 are provided, and correspondingly, a plurality of first electrodes 104 are provided.

In some embodiments, a material of the substrate 100 includes an elemental semiconductor material. Specifically, the elemental semiconductor material is composed of a single element, for example, silicon or germanium. The elemental semiconductor material may be a single crystal state, a polycrystalline state, an amorphous state, or a microcrystalline state (i.e., a state having both the single crystal state and the amorphous state), for example, the silicon may be at least one of monocrystalline silicon, polycrystalline silicon, amorphous silicon, or microcrystalline silicon.

In some embodiments, the material of the substrate 100 includes a compound semiconductor material. Conventional compound semiconductor materials include, but are not limited to, silicon germanium, silicon carbide, gallium arsenide, indium gallium, perovskite, cadmium telluride, copper indium selenium, etc.

The substrate 100 includes an N-type semiconductor substrate or a P-type semiconductor substrate. The N-type semiconductor substrate is doped with an N-type doping element, and the N-type doping element may be any one of group V elements such as phosphorus (P), bismuth (Bi), antimony (Sb), or arsenic (As). The P-type semiconductor substrate is doped with a P-type doping element, and the P-type doping element may be any one of group III elements such as boron (B), aluminum (Al), gallium (Ga), or indium (In).

The substrate 100 has a first surface 1 and a second surface 2 opposite to each other. In some embodiments, the solar cell is a single-sided cell, and the second surface 2 of the substrate 100 serves as a light receiving surface for receiving incident light, and the first surface 1 serves as a backlight surface.

In some embodiments, the solar cell is a double-sided cell, and both the second surface 2 and the first surface 1 of the substrate 100 serve as light receiving surfaces for receiving incident light. It should be understood that the backlight surface in the embodiments of the present disclosure may also receive incident light, but has a degree of reception of the incident light weaker than a degree of reception of the incident light by the light receiving surface, and thus is defined as the backlight surface.

In some embodiments, a texturing process may be performed on at least one surface of the second surface 2 and the first surface 1 of the substrate 100 to make the at least one surface of the second surface 2 and the first surface 1 of the substrate 100 form a textured surface, so that the absorption utilization rate of the second surface 2 and the first surface 1 of the substrate 100 on the incident light is increased. In some embodiments, the textured surface may be a pyramid textured surface, and the pyramid textured surface is a conventional textured surface, which not only reduces the reflectivity of the surface of the substrate 100, but also forms an optical trap, thereby enhancing the absorption effect of the substrate 100 on the incident light and improving the conversion efficiency of the solar cell.

Specifically, if the solar cell is the single-sided cell, the light receiving surface of the substrate 100 is formed as the textured surface, e.g., the pyramid textured surface, and the backlight surface of the substrate 100 is a polished surface, that is, the backlight surface of the substrate 100 is flatter than the light receiving surface. It should be noted that, for the single-sided cell, both the light receiving surface and the backlight surface of the substrate 100 may be formed as textured surfaces.

If the solar cell is the double-sided cell, both the light receiving surface and the backlight surface of the substrate 100 are formed as textured surfaces.

Referring to FIG. 2, in some embodiments, the first electrode 104 covers a part of two opposing sidewalls of the second passivation contact structure 102 in the first direction X, and a portion of the first electrode 104 covering the part of two opposing sidewalls of the second passivation contact structure 102 is formed between two adjacent first passivation films 103.

Specifically, the two adjacent first passivation films 103 cover a remaining part of two opposing sidewalls of the second passivation contact structure 102 in the first direction X, and a bottom of the portion of the first electrode 104 covering the part of two opposing sidewalls of the second passivation contact structure 102 is in contact with the first passivation films 103. That is, the first passivation films 103 are further provided between the portion of the first electrode 104 covering the part of two opposing sidewalls of the second passivation contact structure 102 and the first passivation contact structure 101, and the first passivation films 103 are further in contact with side surfaces of the portion of the first electrode 104 covering the part of two opposing sidewalls of the second passivation contact structure 102.

An orthographic projection of the first electrode 104 on the first surface 1 is in the first region 11 as well as the second region 12, and an orthographic projection of the first passivation film 103 on the first surface 1 may coincide with the second region 12.

Referring to FIG. 3, in some embodiments, the first electrode 104 may also cover whole two opposing sidewalls of the second passivation contact structure 102 in the first direction X and a portion of a top surface of the first passivation contact structure 101, and sidewalls of first passivation films 103 facing the second passivation contact structure 102 are in contact with the portion of the first electrode 104 formed on the two opposing sidewalls of the second passivation contact structure 102.

Since the first electrode 104 covers the whole two opposing sidewalls of the second passivation contact structure 102 in the first direction X, and the second passivation contact structure 102 is located on the top surface of the first passivation contact structure 101, the portion of the first electrode 104 formed on the two opposing sidewalls of the second passivation contact structure 102 in the first direction X further covers the portion of the top surface of the first passivation contact structure 101. In this way, the first electrode 104 is not only in contact with the top surface and the two opposing sidewalls of the second passivation contact structure 102, but also in contact with part of the first passivation contact structure 101, so that carriers in both the first passivation contact structure 101 and the second passivation contact structure 102 can be effectively collected.

The first passivation films 103 are in contact with side surfaces of the portion of the first electrode 104 that face away from the second passivation contact structure 102, the portion of the first electrode 104 forming on the two opposing sidewalls of the second passivation contact structure 102 in the first direction X. It is not difficult to find that the orthographic projection of the first electrode 104 on the first surface 1 is in the first region 11 as well as the second region 12, and the orthographic projection of the first passivation film 103 on the first surface 1 coincides with a part of the second region 12.

Figure 5:
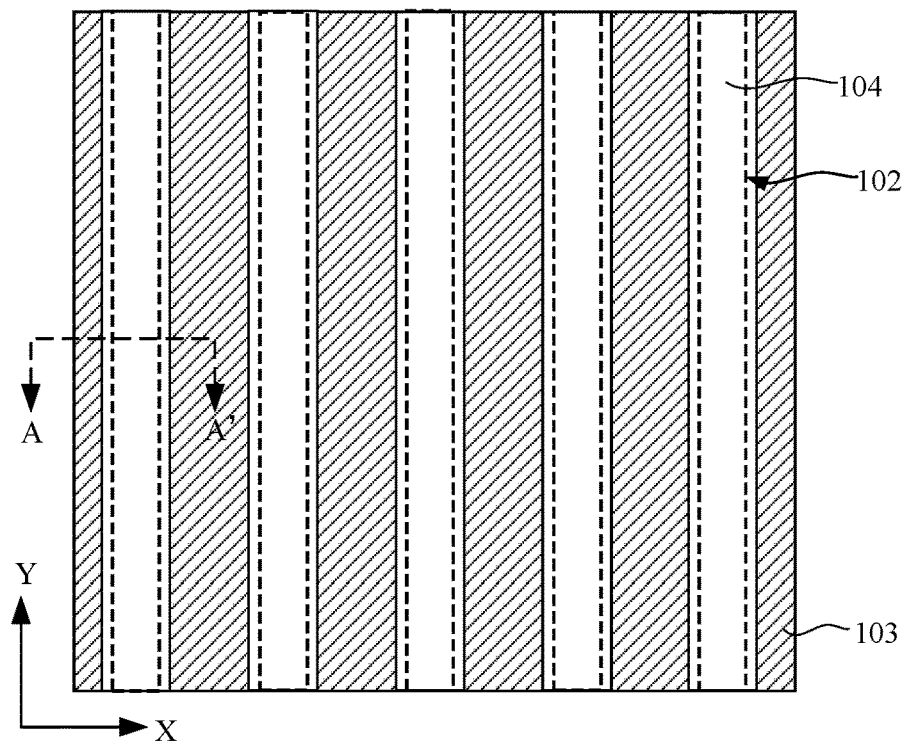
FIG. 5 is another schematic top view of a solar cell according to an embodiment of the present disclosure.
Figure 6:
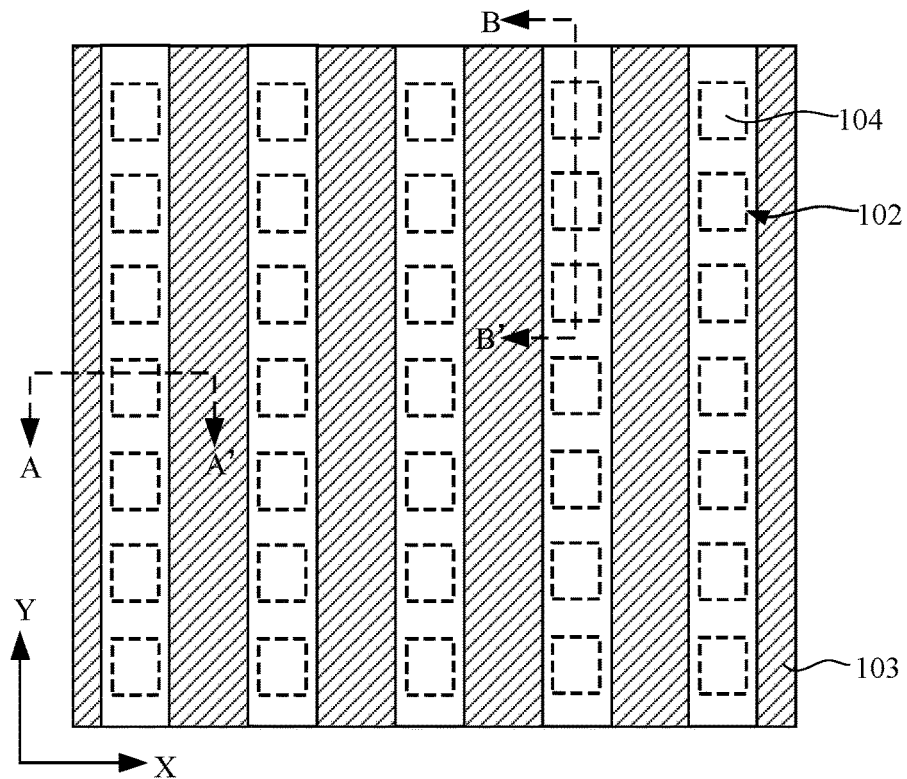
FIG. 6 is yet another schematic top view of a solar cell according to an embodiment of the present disclosure.
Figure 7:
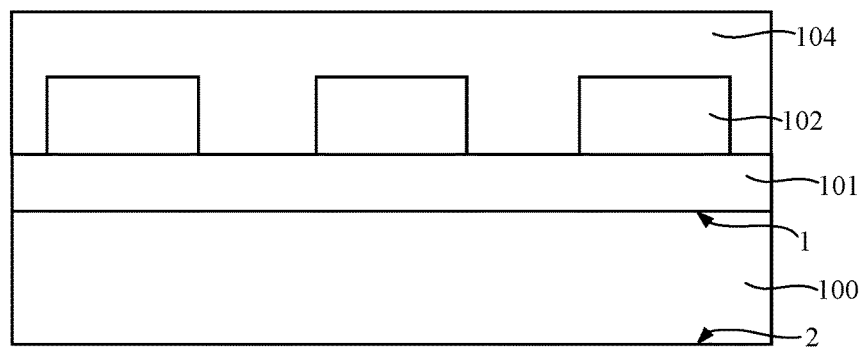
FIG. 7 is a schematic cross-sectional view of the solar cell in FIG. 6 along line BB'.

FIG. 5 is another schematic top view of a solar cell according to an embodiment of the present disclosure. FIG. 6 is yet another schematic top view of a solar cell according to an embodiment of the present disclosure. FIG. 7 is a schematic cross-sectional view of the solar cell in FIG. 6 along line BB'.

Referring to FIG. 5, in some embodiments, a plurality of second passivation contact structures 102 are provided, the plurality of second passivation contact structures 102 are arranged at intervals in the first direction X, and each second passivation contact structure 102 extends in the second direction Y. In FIG. 5, the second passivation contact structures 102 are shown as dashed boxes with a reference numeral '102'.

The orthographic projection of each second passivation contact structure 102 on the first surface 1 may coincide with the first region 11, a number of the first electrodes 104 may be the same as a number of the second passivation contact structures 102, and the first electrodes 104 and the second passivation contact structures 102 are in one-to-one correspondence. The first electrode 104 covers only the side surfaces of the second passivation contact structure 102 in the first direction X (i.e., not cover two opposing sidewalls of the second passivation contact structure 102 in the second direction Y).

Both the first electrode 104 and the second passivation contact structure 102 extend in the second direction Y, that is, a gap between the first electrode 104 and the substrate 100 is filled with the first passivation contact structure 101 and the second passivation contact structure 102, so that the risk that the first electrode 104 penetrates the first passivation contact structure 101 and the second passivation contact structure 102 to be in contact with the substrate 100 is greatly reduced in the actual process of preparing the first electrode 104.

In some embodiments, a plurality of second passivation contact structures 102 are provided, and the plurality of second passivation contact structures 102 are arranged at intervals in both the first direction X and the second direction Y. Specifically, the plurality of second passivation contact structures 102 are arranged in a plurality of columns and in a plurality of rows, each row of second passivation contact structures 102 are arranged at intervals along the first direction X, and each column of second passivation contact structures 102 are arranged at intervals along the second direction Y. In FIG. 6, the second passivation contact structures 102 are shown as dashed boxes with a reference numeral '102'.

A plurality of first electrodes 104 are provided, the plurality of first electrodes 104 are arranged at intervals in the first direction X, and each first electrode 104 extends in the second direction Y. One first electrode 104 covers a top surface of each second passivation contact structure 102 in a column of second passivation contact structures 102, and the first electrode 104 further covers two opposing sidewalls of the second passivation contact structures 102 in the first direction X and two opposing sidewalls of the second passivation contact structures 102 in the second direction Y. In this way, the contact area between the first electrode 104 and the second passivation contact structure 102 can be further increased, and the electrical contact performance of the first electrode 104 and the second passivation contact structure 102 is further enhanced, thereby improving the collection of carriers by the first electrode 104.

Each first electrode 104 further covers portions of the top surface of the first passivation contact structure 101 between two adjacent second passivation contact structures 102 in each column of the second passivation contact structures 102.

Figure 8:
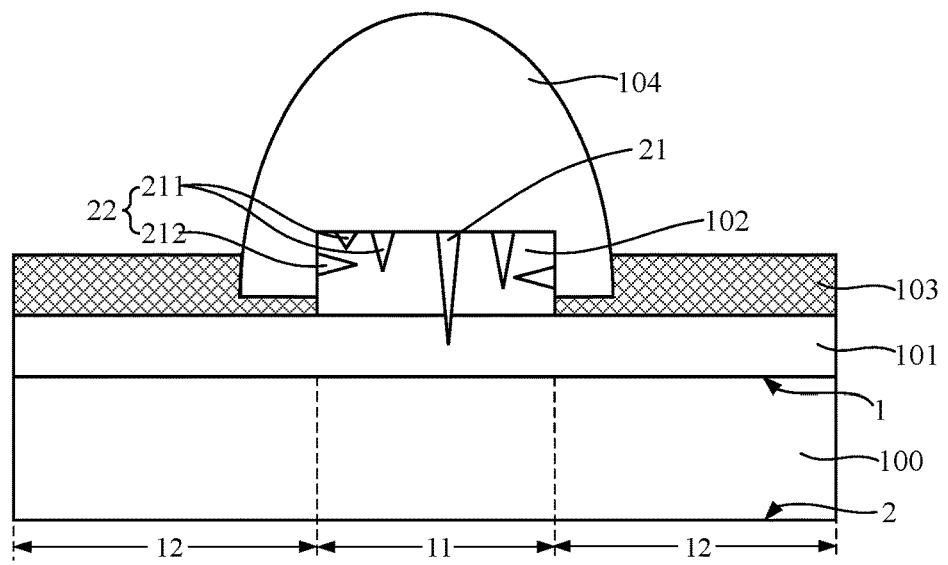
FIG. 8 is a schematic cross-sectional structural diagram of a third solar cell according to an embodiment of the present disclosure.
Figure 9:
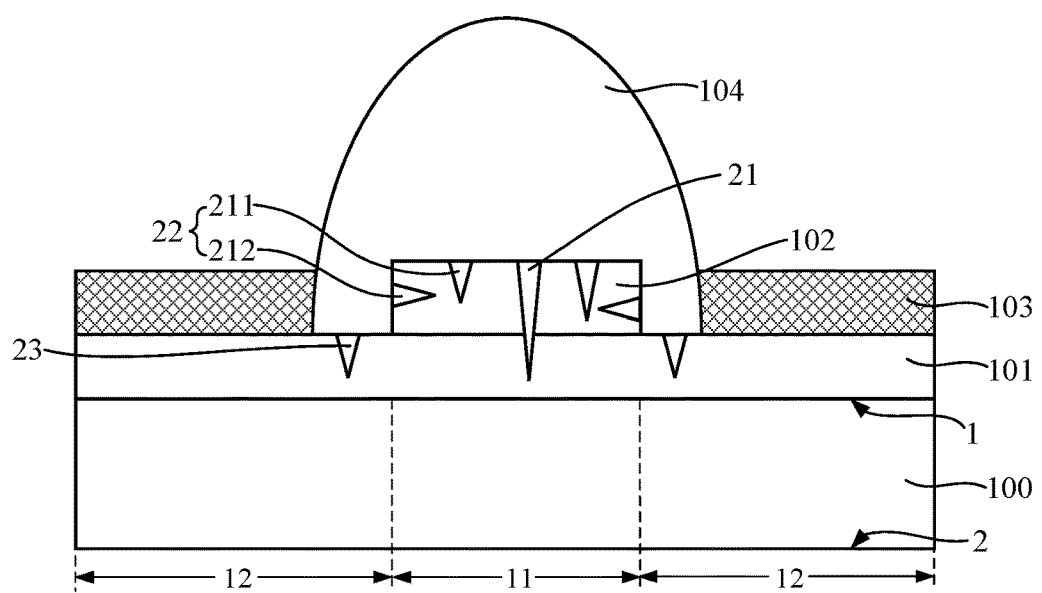
FIG. 9 is a schematic cross-sectional structural diagram of a fourth solar cell according to an embodiment of the present disclosure.

FIG. 8 is a schematic cross-sectional structural diagram of a third solar cell according to an embodiment of the present disclosure. FIG. 9 is a schematic cross-sectional structural diagram of a fourth solar cell according to an embodiment of the present disclosure. In the solar cell shown in FIG. 8, the first electrode 104 covers a part of two opposing sidewalls of the second passivation contact structure 102 in the first direction X, and in the solar cell shown in FIG. 9, the first electrode 104 covers the whole two opposing sidewalls of the second passivation contact structure 102 in the first direction X.

Referring to FIG. 8 and FIG. 9, in some embodiments, each first electrode 104 includes a plurality of conductive extensions, and the plurality of conductive extensions include first conductive extensions 21 penetrating the second passivation contact structure 102 to extend into the first passivation contact structure 101, and second conductive extensions 22 extending into the second passivation contact structure 102. It should be noted that the second conductive extensions 22 extend into the second passivation contact structure 102 without extending into the first passivation contact structure 101.

Carriers in the first passivation contact structure 101 are transmitted to the first conductive extensions 21, carriers in the second passivation contact structure 102 are transmitted to the first conductive extensions 21 and the second conductive extensions 22, thereby forming photocurrent in the first electrode 104, and then transmitting the photocurrent to the outside through the first electrode 104.

The plurality of conductive extensions may be spaced apart from each other, and the conductive extensions extend into the first passivation contact structure 101 and the second passivation contact structure 102 instead of the whole first electrode 104 penetrating the first passivation contact structure 101 and the second passivation contact structure 102, so that excessive damage to the first passivation contact structure 101 and the second passivation contact structure 102 can be avoided, which ensures better performance of the first passivation contact structure 101 and the second passivation contact structure 102.

In some embodiments, the conductive extension may have a spike shape, and a spike portion of the conductive extension is toward the substrate 100. In a specific example, the conductive extension may have an inverted pyramid shape. In this way, an overall volume of the conductive extension is not too large, thereby avoiding damage to the first passivation contact structure 101 and the second passivation contact structure 102.

In some embodiments, a material of the conductive extension includes a metal material, for example, includes any one of silver, gold, aluminum, copper, and nickel.

In some embodiments, a number of the first conductive extensions 21 may be less than a number of the second conductive extensions 22, so that the number of the first conductive extensions 21 extending into the first passivation contact structure 101 is small, the damage caused by the first conductive extensions 21 to the second passivation contact structure 102 is reduced, and the risk that the conductive extensions penetrate the first passivation contact structure 101 to be in contact with the substrate 100 is reduced.

Because the first electrode 104 covers the top surface and at least part of the two opposing sidewalls of the second passivation contact structure 102, referring to FIG. 8 and FIG. 9, in some embodiments, the second conductive extensions 22 include first conductive sub-extensions 211 extending from a top surface of the second passivation contact structure 102 into the second passivation contact structure 102 and second conductive sub-extensions 212 extending from two opposing sidewalls of the second passivation contact structure 102 into the second passivation contact structure 102.

In other words, the second conductive extensions 22 extend into the second passivation contact structure 102 from the top surface and the two opposing sidewalls of the second passivation contact structure 102, so that the contact area between the second conductive extensions 22 and the second passivation contact structure 102 is increased, thereby improving the carrier collection capability of the second conductive extensions 22.

In some embodiments, the first electrode 104 covers only the two opposing sidewalls of the second passivation contact structure 102 in the first direction X (i.e., does not cover the two opposing sidewalls of the second passivation contact structure 102 in the second direction Y), and the second conductive sub-extensions 212 extend into the second passivation contact structure 102 from the two opposing sidewalls of the second passivation contact structure 102 in the first direction X.

In some embodiments, the first electrode 104 further covers the two opposing sidewalls of the second passivation contact structure 102 in the second direction Y, and the second conductive extensions 22 include second conductive sub-extensions 212 extending into the second passivation contact structure 102 from the two opposing sidewalls of the second passivation contact structure 102 in the first direction X and second conductive sub-extensions 212 extending into the second passivation contact structure 102 from the two opposing sidewalls of the second passivation contact structure 102 in the second direction Y.

Figure 10:
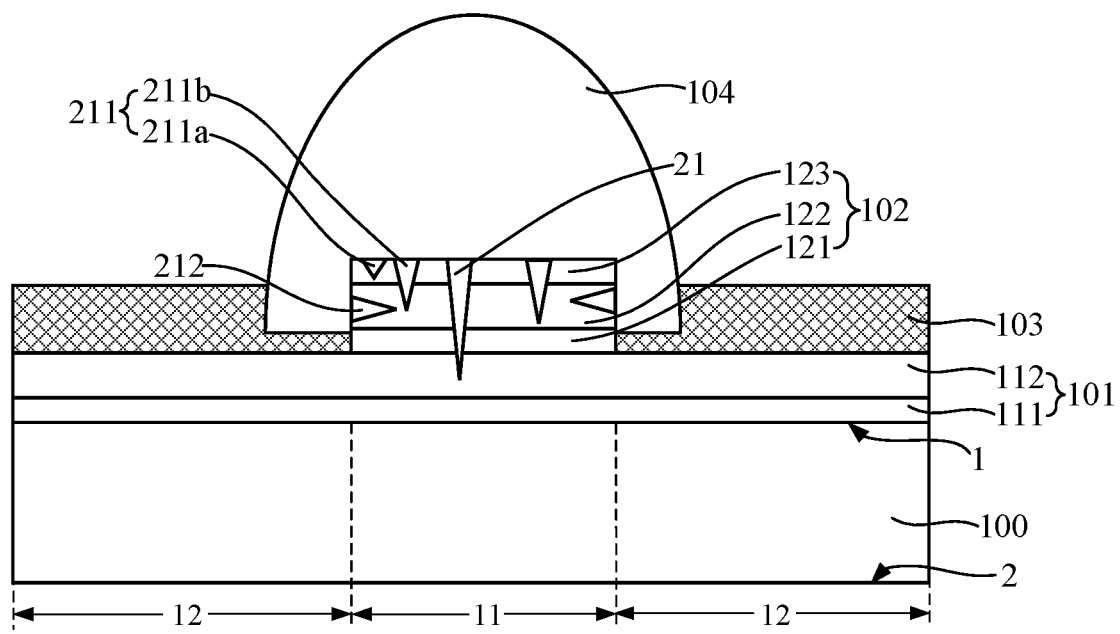
FIG. 10 is a schematic cross-sectional structural diagram of a fifth solar cell according to an embodiment of the present disclosure.
Figure 11:
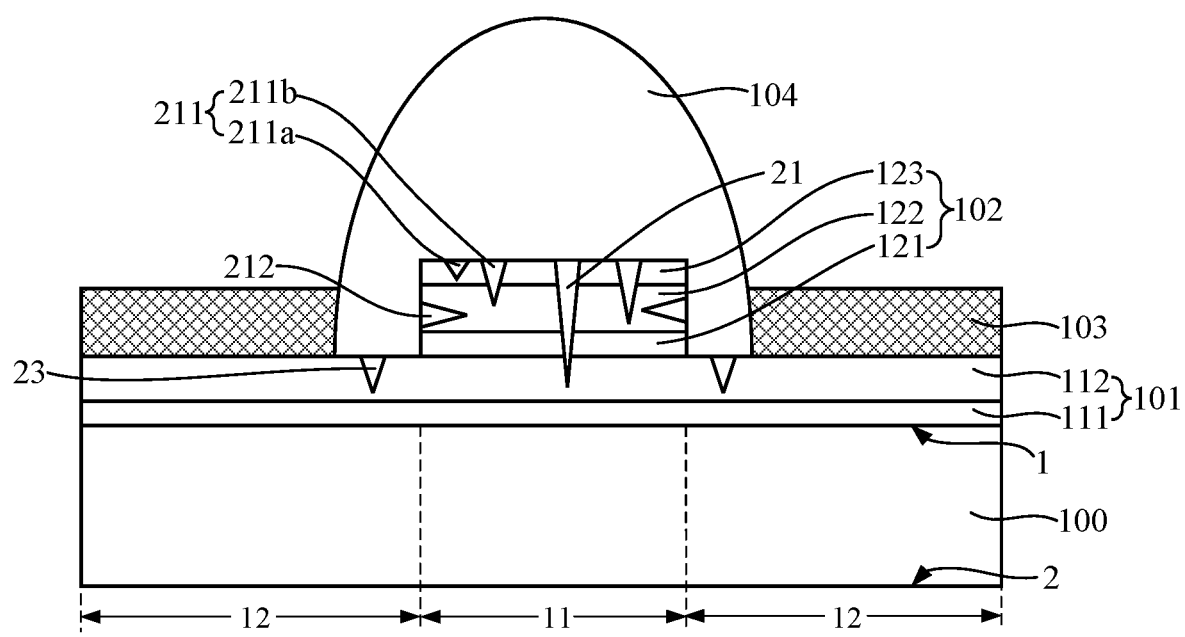
FIG. 11 is a schematic cross-sectional structural diagram of a sixth solar cell according to an embodiment of the present disclosure.

FIG. 10 is a schematic cross-sectional structural diagram of a fifth solar cell according to an embodiment of the present disclosure. FIG. 11 is a schematic cross-sectional structural diagram of a sixth solar cell according to an embodiment of the present disclosure. In the solar cell shown in FIG. 10, each first electrode 104 covers a part of two opposing sidewalls of a second passivation contact structure 102 in the first direction X, and in the solar cell shown in FIG. 11, each first electrode 104 covers whole two opposing sidewalls of a second passivation contact structure 102 in the first direction X.

Referring to FIG. 10 and FIG. 11, in some embodiments, the first passivation contact structure 101 includes a first tunneling layer 111 and a first doped conductive layer 112 stacked in a direction away from the substrate 100, and the first conductive extensions 21 extend into a partial thickness of the first doped conductive layer 112.

The first doped conductive layer 112 forms band-bending on the first surface 1 and forms an built-in electric field, so that a potential barrier to majority carriers is lower than a potential barrier to minority carriers, causing holes to escape from the interface and resulting in a reduced hole concentration, thus the majority carriers in the substrate 100 can be easily tunneled into the first doped conductive layer 112 through the first tunneling layer 111 to realize selective transport of carriers.

A doping element type of the first doped conductive layer 112 is the same as a doping element type of the substrate 100, and a doping element concentration of the first doped conductive layer 112 is greater than a doping element concentration of the substrate 100.

The first conductive extensions 21 extend into a partial thickness of the first doped conductive layer 112, so that a transmission path of carriers in the first doped conductive layer 112 is short, and the carriers are directly collected by the first conductive extensions 21 in the first doped conductive layer 112. The first conductive extensions 21 do not penetrate the first doped conductive layer 112, so as to avoid direct contact with the first tunneling layer 111 and even the substrate 100, which avoids damage to the structure of the first tunneling layer 111.

In some embodiments, a material of the first tunneling layer 111 includes at least one of silicon oxide, aluminum oxide, silicon nitride, or silicon oxynitride. In a specific example, the first tunneling layer 111 may include impurity elements, including one or more of boron, gallium, and phosphorus.

In some embodiments, a thickness of the first tunneling layer 111 is in a range of 0.5 nm to 2 nm.

In some embodiments, a material of the first doped conductive layer 112 includes at least one of amorphous silicon, polysilicon, or silicon carbide. In a specific example, the first doped conductive layer 112 may include impurity elements, including one or more of boron, gallium, phosphorus, and carbon.

In some embodiments, a thickness of the first doped conductive layer 112 is in a range of 5 nm to 90 nm, for example, may be 5 nm to 10 nm, 10 nm to 20 nm, 20 nm to 30 nm, 30 nm to 40 nm, 40 nm to 50 nm, 50 nm to 60 nm, 60 nm to 70 nm, 70 nm to 80 nm, or 80 nm to 90 nm.

Referring to FIG. 10 and FIG. 11, in some embodiments, each second passivation contact structure 102 includes a second tunneling layer 121, a second doped conductive layer 122 and an amorphous silicon layer 123 stacked in a direction away from the substrate 100, and the first conductive sub-extensions 211 includes a first plurality of first conductive sub-extensions 211a extending into the amorphous silicon layer 123 and a second plurality of first conductive sub-extensions 211b extending into the second doped conductive layer 122.

A doping element type of the second doped conductive layer 122 is the same as a doping element type of the substrate 100, and a doping element concentration of the second doped conductive layer 122 is greater than a doping element concentration of the substrate 100.

Carriers are tunneled into the second doped conductive layer 122 through the second tunneling layer 121, and are collected by the second plurality of first conductive sub-extensions 211b, so that photocurrent is formed in the first electrode 104 and is transmitted to the outside through the first electrode 104.

The amorphous silicon layer 123 is formed on the second doped conductive layer 122, so that the possibility that conductive paste for preparing the first electrode 104 penetrates the second passivation contact structure 102 and the first passivation contact structure 101 can be further reduced due to a relatively large density of the amorphous silicon layer 123.

A doping element type of the amorphous silicon layer 123 is the same type as the doping element type of the substrate 100, and a doping element concentration of the amorphous silicon layer 123 is greater than the doping element concentration of the substrate 100, so that the amorphous silicon layer 123 can conduct electricity. Carriers in the amorphous silicon layer 123 are collected by the first plurality of first conductive sub-extensions 211a and the second plurality of first conductive sub-extensions 211b, thereby forming the photocurrent in the first electrode 104 and then transmitting the photocurrent to the outside through the first electrode 104.

In some embodiments, each second passivation contact structure 102 includes only the second tunneling layer and the second doped conductive layer stacked in the direction away from the substrate 100, and the first conductive sub-extensions may only extend into the second doped conductive layer. Since the second doped conductive layer itself has good electrical properties, compared with the second passivation contact structure including the amorphous silicon layer, the second passivation contact structure includes only the second tunneling layer and the second doped conductive layer stacked in the direction away from the substrate 100, so that the second doped conductive layer in the second passivation contact structure is relatively large, realizing better electrical performance of the overall second passivation contact structure, thereby improving the electrical contact performance between the second passivation contact structure and the first conductive sub-extensions.

In some embodiments, a material of the second doped conductive layer 122 includes at least one of amorphous silicon, polysilicon, or silicon carbide. In a specific example, the second doped conductive layer 122 may include impurity elements, including one or more of boron, gallium, phosphorus, and carbon.

In some embodiments, a thickness of the second doped conductive layer 122 is in a range of 5 nm to 90 nm, for example, may be 5 nm to 10 nm, 10 nm to 20 nm, 20 nm to 30 nm, 30 nm to 40 nm, 40 nm to 50 nm, 50 nm to 60 nm, 60 nm to 70 nm, 70 nm to 80 nm, or 80 nm to 90 nm.

In some embodiments, a material of the second tunneling layer 121 includes at least one of silicon oxide, aluminum oxide, silicon nitride, or silicon oxynitride. In a specific example, the second tunneling layer 121 may include impurity elements, including one or more of boron, gallium, and phosphorus.

In some embodiments, the thickness of the first doped conductive layer 112 is less than the thickness of the second doped conductive layer 122. The thickness of the first doped conductive layer 112 is relatively small, so that the parasitic absorption of the first doped conductive layer 112 on incident light is reduced, and the thickness of the second doped conductive layer 122 is relatively large, so that, on the one hand, the second doped conductive layer 122 has a larger contact area with the conductive extensions to form good ohmic contact, and on the other hand, the problem that the first electrode 104 penetrates the second passivation contact structure 102 and the first passivation contact structure 101 to be in contact with the substrate 100 is avoided.

Referring to FIG. 9 and FIG. 11, in some embodiments, the first electrode 104 covers whole two opposing sidewalls of the second passivation contact structure 102 in the first direction X and a portion of a top surface of the first passivation contact structure 101, and the first electrode 104 includes a plurality of conductive extensions, the plurality of conductive extensions include third conductive extensions 23, the third conductive extensions 23 extending from the top surface of the first passivation contact structure 101 into a partial thickness of the first passivation contact structure 101 to be in electrical contact with the first passivation contact structure 101.

Since the first electrode 104 further covers a portion of the top surface of the first passivation contact structure 101, the conductive extensions may further extend into the first passivation contact structure 101 from the top surface of the first passivation contact structure 101, which improves the contact area between the first electrode 104 and the first passivation contact structure 101, so that the first electrode 104 can more effectively collect the carriers in the first passivation contact structure 101, thereby improving the photoelectric conversion performance of the solar cell.

In some embodiments, a thickness of the second tunneling layer 121 is in a range of 0.5 nm to 2 nm.

Figure 12:
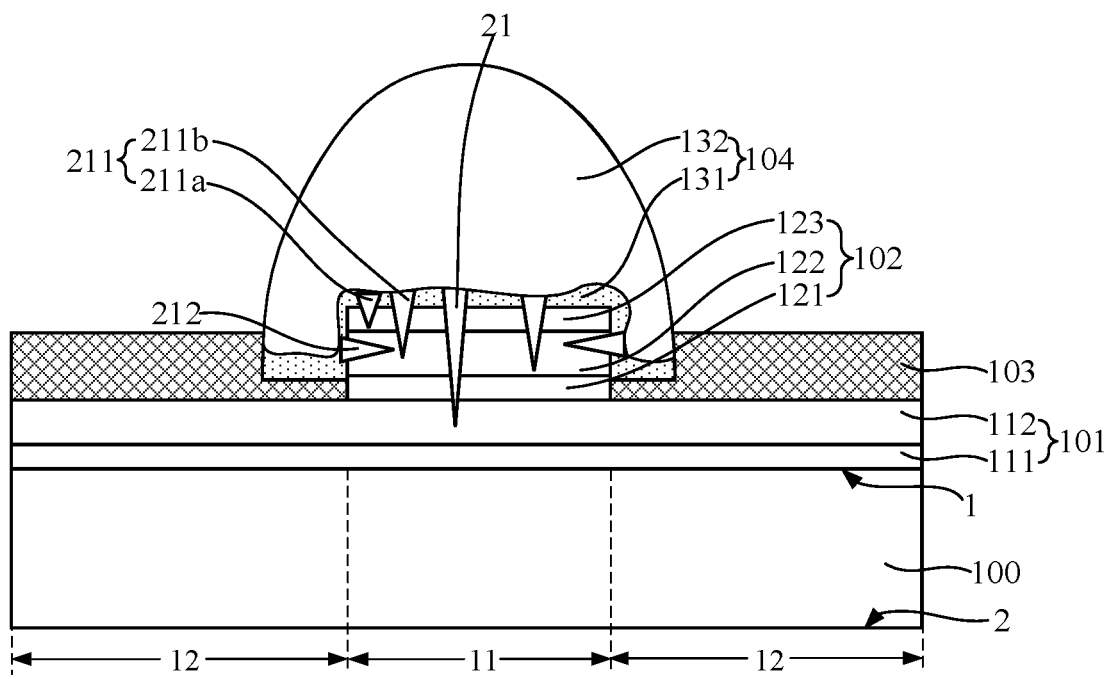
FIG. 12 is a schematic cross-sectional structural diagram of a seventh solar cell according to an embodiment of the present disclosure.
Figure 13:
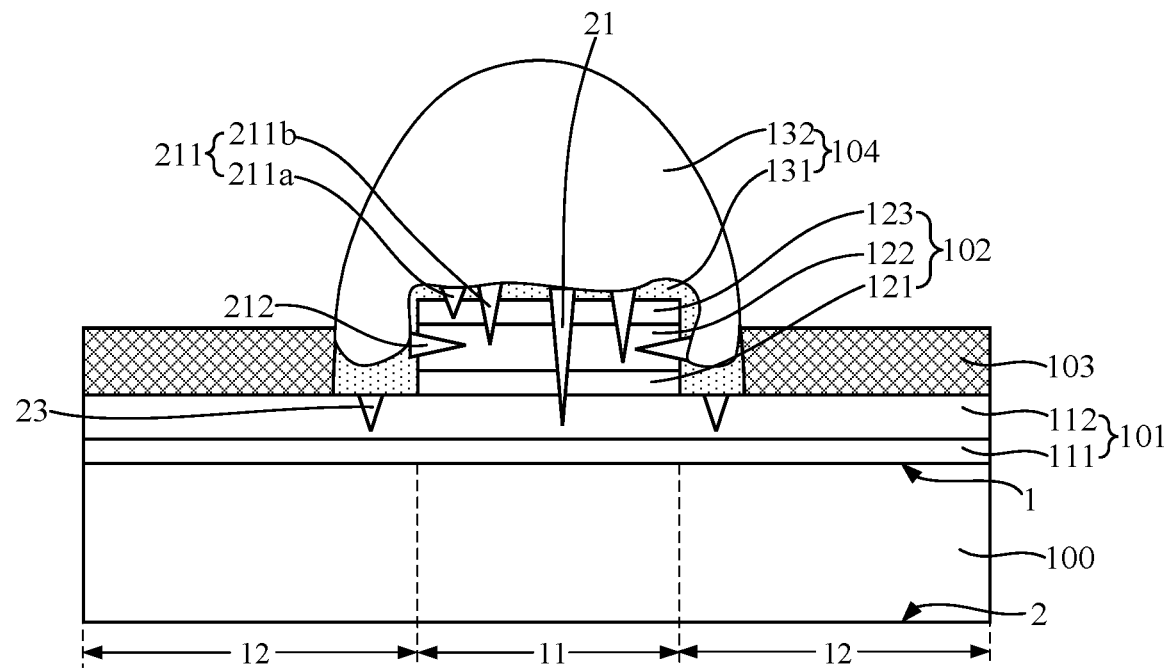
FIG. 13 is a schematic cross-sectional structural diagram of an eighth solar cell according to an embodiment of the present disclosure.

FIG. 12 is a schematic cross-sectional structural diagram of a seventh solar cell according to an embodiment of the present disclosure. FIG. 13 is a schematic cross-sectional structural diagram of an eighth solar cell according to an embodiment of the present disclosure. In the solar cell shown in FIG. 12, each first electrode 104 covers a part of two opposing sidewalls of a second passivation contact structure 102 in the first direction X, and in the solar cell shown in FIG. 13, each first electrode 104 covers whole two opposing sidewalls of the second passivation contact structure 102 in the first direction X.

In some embodiments, the first electrode 104 further includes a glass frit layer 131 covering a top surface of the second passivation contact structure 102 and at least part of two opposing sidewalls of the second passivation contact structure 102 in the first direction X, and a slurry body layer 132 formed on the glass frit layer 131. The conductive extensions are formed in the glass frit layer 131 and extend from the glass frit layer 131 to the second passivation contact structure 102. A material of the slurry body layer 132 includes a material of the conductive extensions.

The glass frit layer 131 is formed of glass frit that acts as corrosion and bonding in the conductive paste forming the first electrode 104. In some embodiments, the material of the glass frit layer 131 includes a glass material, and the glass material generally includes a transition metal oxide composite, for example, may include one or more of compounds such as silicon oxide, silicon nitride, silicon oxynitride, silicate, lead oxide, aluminum oxide, and boric acid.

The slurry body layer 132 plays a role of conductivity, majority carriers are transmitted into the glass frit layer 131 through the conductive extensions and then are transmitted to the slurry body layer 132 through the glass frit layer 131 to form the photocurrent in the slurry body layer 132, and the slurry body layer 132 is electrically connected to the outside, so that the photocurrent is transmitted to the outside.

In some embodiments, a material of the conductive extensions is the same as a material of the slurry body layer 132, and the conductive extensions are derivative structures of the slurry body layer 132, that is, the conductive extensions may be formed by grain regrowth and recrystallization on the basis of the slurry body layer 132.

In some embodiments, the material of the slurry body layer 132 includes a metal material, for example, may be at least one of silver, gold, aluminum, copper, and nickel. In a specific example, the material of the slurry body layer 132 is silver, and the material of the conductive extensions is silver.

Figure 14:
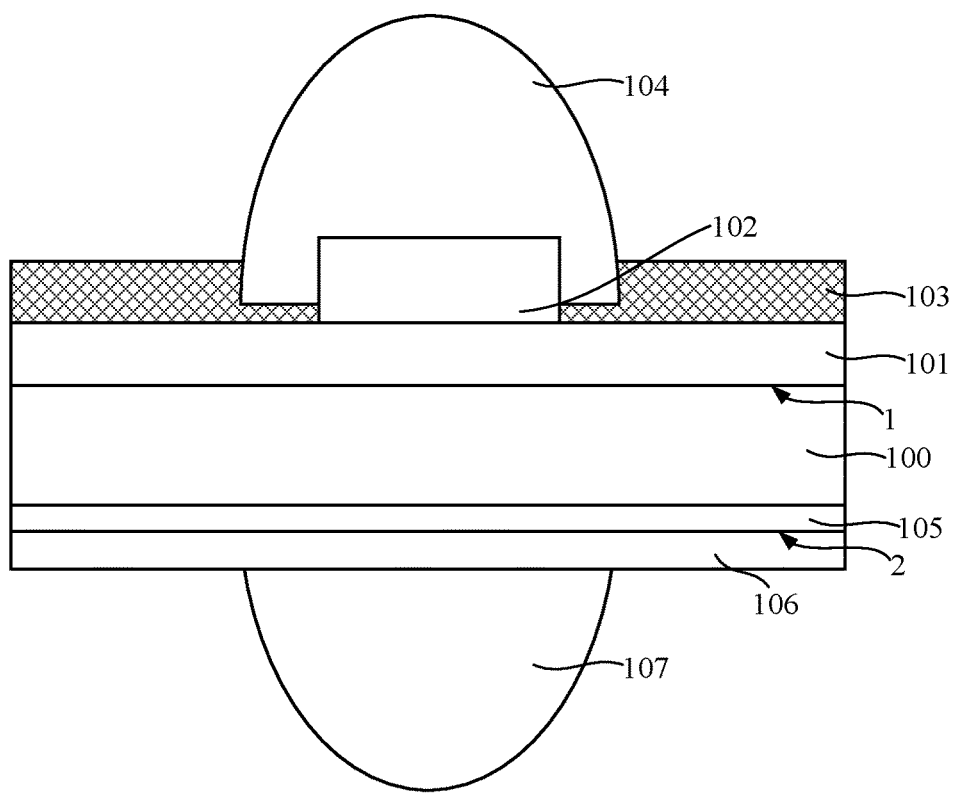
FIG. 14 is a schematic cross-sectional structural diagram of a ninth solar cell according to an embodiment of the present disclosure.
Figure 15:
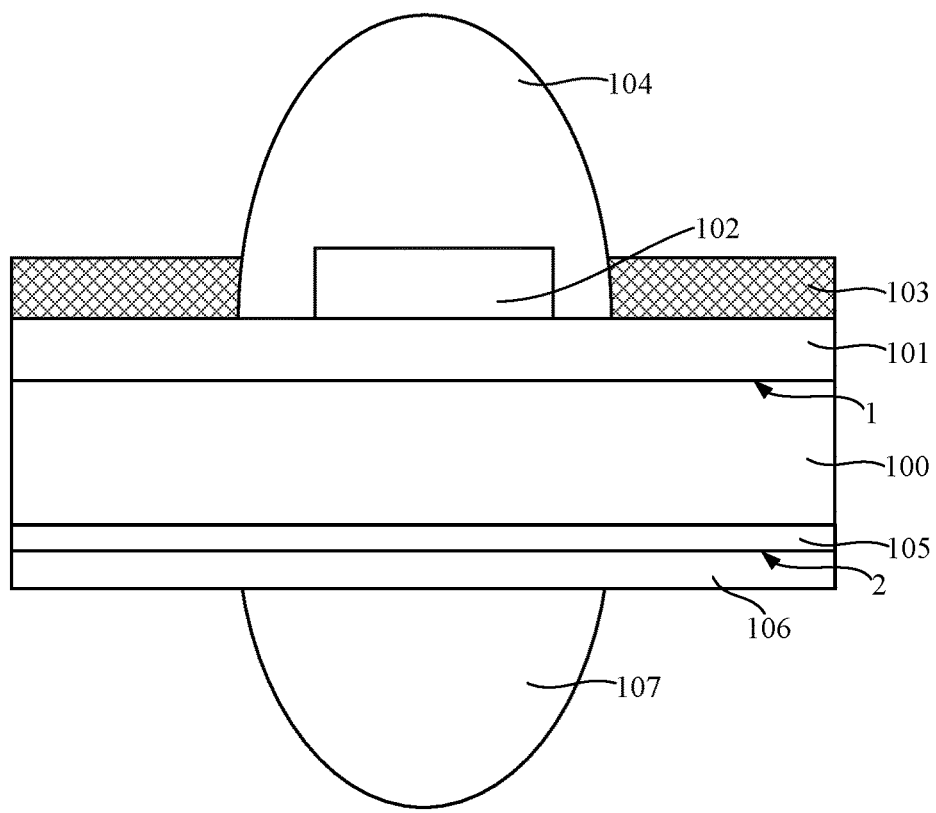
FIG. 15 is a schematic cross-sectional structural diagram of a tenth solar cell according to an embodiment of the present disclosure.

FIG. 14 is a schematic cross-sectional structural diagram of a ninth solar cell according to an embodiment of the present disclosure. FIG. 15 is a schematic cross-sectional structural diagram of a tenth solar cell according to an embodiment of the present disclosure. In the solar cell shown in FIG. 14, each first electrode 104 covers a part of two opposing sidewalls of a second passivation contact structure 102 in the first direction X, and in the solar cell shown in FIG. 15, each first electrode 104 covers whole two opposing sidewalls of the second passivation contact structure 102 in the first direction X.

Referring to FIG. 14 and FIG. 15, in some embodiments, the solar cell is a TOPCON cell, and the solar cell further includes an emitter 105 formed in a portion of the substrate 100 and coplanar with the second surface 2. A doping element type of the emitter 105 is different from the doping element type of the substrate 100, thereby forming a PN junction with the substrate 100.

In some embodiments, the solar cell further includes a second passivation layer 106 formed on the emitter 105, so that a good passivation effect on the second surface 2 of the substrate 100 is achieved, a defect state density of the second surface 2 of the substrate 100 is reduced, and carrier recombination on the second surface 2 of the substrate 100 is better suppressed. The second passivation layer 106 can also achieve a better antireflection effect, reduce the reflection of the second surface 2 of the substrate 100 on the incident light, and improve the utilization rate of the incident light by the substrate 100.

In some embodiments, a material of the second passivation layer 106 includes at least one of silicon oxide, aluminum oxide, silicon nitride, or silicon oxynitride.

In some embodiments, the second passivation layer 106 includes a single-layer structure. In some embodiments, the second passivation layer 106 includes a multi-layer structure, and materials of the layers in the multi-layer structure are different from each other, or materials of some layers in the multi-layer structure are different from each other and materials of remaining layers are the same. For example, the second passivation layer 106 is a multi-layer structure of a silicon nitride layer and an aluminum oxide layer, or a silicon nitride layer and an aluminum oxide layer that are stacked, etc.

In some embodiments, the solar cell further includes a plurality of second electrodes 107 arranged at intervals in the first direction X, and each of the plurality of second electrodes 107 extends along the second direction Y. Each second electrode 107 is formed on a surface of the second passivation layer 106 and penetrates a respective second passivation layer 106 to be in electrical contact with the emitter 105. In some embodiments, a material of the second electrode 107 includes a metal material, for example, copper, silver, nickel, or aluminum.

In the solar cell provided in the above embodiments, the current collection capability of the first electrode 104 is enhanced, the photoelectric conversion efficiency of the solar cell is improved, the problem that the first electrode 104 directly contacts the substrate 100 is avoided, meanwhile, parasitic absorption of incident light is reduced, and high utilization rate of incident light by the solar cell is ensured.

Some embodiments of the present disclosure further provide a method for preparing a solar cell, which may be used to prepare the solar cell provided in the foregoing embodiments. The method for preparing the solar cell provided in some embodiments of the present disclosure is described in detail below with reference to the accompanying drawings.

A method for preparing a solar cell include the following operations.

Figure 16:
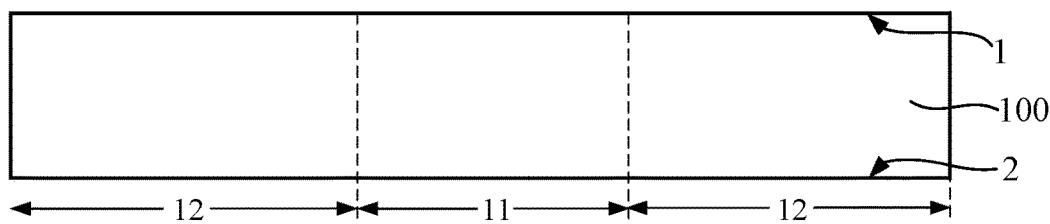
FIG. 16 is a schematic cross-sectional structural diagram corresponding to an operation of providing a substrate in a method for preparing a solar cell according to an embodiment of the present disclosure.

Referring to FIG. 4 as well as FIG. 16, a substrate 100 is provided, and the substrate 100 has a first surface 1, the first surface 1 including first regions 11 and second regions 12 which alternatingly arranged in the first direction X. FIG. 16 is a schematic cross-sectional structural diagram corresponding to an operation of providing a substrate in a method for preparing a solar cell according to an embodiment of the present disclosure, i.e., a schematic cross-sectional diagram of the solar cell in FIG. 4 along line AA'.

In some embodiments, the material of the substrate 100 includes an elemental semiconductor material. Specifically, the elemental semiconductor material includes a single element such as silicon or germanium. The elemental semiconductor material may be in a monocrystalline state, a polycrystalline state, an amorphous state, or a microcrystalline state (i.e., a state having both the monocrystalline state and the amorphous state), e.g., silicon may be at least one of monocrystalline silicon, polycrystalline silicon, amorphous silicon, or microcrystalline silicon.

In some embodiments, the material of the substrate 100 includes a compound semiconductor material. Conventional compound semiconductor materials include, but are not limited to, silicon germanium, silicon carbide, gallium arsenide, indium gallium, chalcogenide, cadmium telluride, copper indium selenide, etc.

The substrate 100 includes an N-type semiconductor substrate or a P-type semiconductor substrate. The N-type semiconductor substrate is doped with an N-type doping element, and the N-type doping element may be any one of group V elements such as phosphorus (P), bismuth (Bi), antimony (Sb), or arsenic (As). The P-type semiconductor substrate is doped with a P-type doping element, and the P-type doping element may be any one of group III elements such as boron (B), aluminum (Al), gallium (Ga), or indium (In).

The substrate 100 has a first surface 1 and a second surface 2 opposite to each other. In some embodiments, a texturing process may be performed on at least one surface of the second surface 2 and the first surface 1 of the substrate 100 to make the at least one surface of the second surface 2 and the first surface 1 of the substrate 100 form a textured surface, so that the absorption utilization rate of the second surface 2 and the first surface 1 of the substrate 100 on the incident light is increased. In some embodiments, the textured surface may be a pyramid textured surface.

In some embodiments, the first regions 11 and the second regions 12 may both be plurality.

Figure 17:
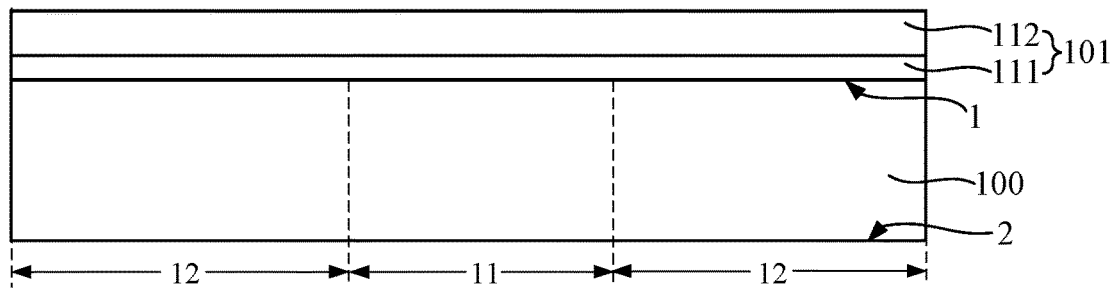
FIG. 17 is a schematic cross-sectional structural diagram corresponding to an operation of forming a first passivation contact structure in a method for preparing a solar cell according to an embodiment of the present disclosure.

Referring to FIG. 17, a first passivation contact structure 101 is formed on the first surface 1, and the first passivation contact structure 101 is in the first regions 11 as well as the second regions 12.

In some embodiments, the first passivation contact structure 101 includes a first tunneling layer 111 and a first doped conductive layer 112 stacked in a direction away from the substrate 100.

In some embodiments, a material of the first tunneling layer 111 includes at least one of silicon oxide, aluminum oxide, silicon nitride, silicon oxynitride, amorphous silicon, or polycrystalline silicon.

In some embodiments, a deposition process may be used to form the first tunneling layer 111 on the first surface 1. The deposition process may include any one of atomic layer deposition or plasma-enhanced chemical vapor deposition. In some embodiments, the material of the first tunneling layer 111 is silicon oxide, then a method for forming the first tunneling layer 111 may also include any of a high temperature thermal oxidation method, an ozone oxidation method, or a wet oxidation method with an oxidizing acid solution.

In some embodiments, a material of the first doped conductive layer 112 includes at least one of amorphous silicon, polysilicon, or silicon carbide. Taking the material of the first doped conductive layer 112 being polysilicon as an example, in some embodiments, the method for forming the first doped conductive layer 112 includes: forming an intrinsic amorphous silicon layer on the surface of the first tunneling layer 111 using a deposition process, for example, the first intrinsic amorphous silicon layer is formed using a low-pressure chemical vapor deposition method or a plasma enhanced chemical vapor deposition method. The first intrinsic amorphous silicon layer is then subjected to a doping process to inject a first doping element into the first intrinsic polysilicon layer, and the first intrinsic amorphous silicon layer is polycrystallized by a high-temperature annealing process to form the first doped conductive layer 112. In some embodiments, the first doping element may be doped in situ during depositing the first intrinsic amorphous silicon layer, the first doping element has a conductive type that is the same as that of the substrate 100, and the first doping element may be boron or phosphorus, etc.

Referring to FIG. 18 to FIG. 21, second passivation contact structures 102 are formed on the first passivation contact structure 101, an orthographic projection of each second passivation contact structure 102 on the first surface 1 is within a respective first region 11.

In some embodiments, each second passivation contact structure 102 includes a second tunneling layer 121, a second doped conductive layer 122 and an amorphous silicon layer 123 stacked in a direction away from the substrate 100. In some embodiments, a method for forming the second passivation contact structure 102 includes the following operations.

Figure 18:
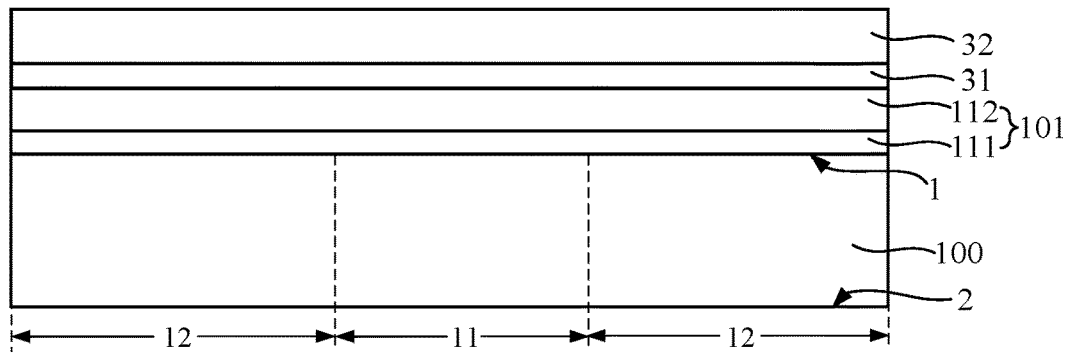
FIG. 18 is a schematic diagram of a cross-sectional structure corresponding to an operation of forming an initial tunneling layer and an initial doped polysilicon layer in a method for preparing a solar cell according to an embodiment of the present disclosure.

Referring to FIG. 18, an initial tunneling layer 31 and an initial doped polysilicon layer 32 that are stacked are formed sequentially on the first passivated contact structure 101. Orthographic projections of the initial tunneling layer 31 and the initial doped polysilicon layer 32 on the first surface 1 coincide with the first regions 11 and the second regions 12.

In some embodiments, a method for forming the initial tunneling layer 31 includes: forming the initial tunneling layer 31 on the first surface 1 using a deposition process, the deposition process may include one of atomic layer deposition or plasma enhanced chemical vapor deposition. In some embodiments, a material of the initial tunneling layer 31 includes silicon oxide, then the method for forming the initial tunneling layer 31 may also include any of a high temperature thermal oxidation method, an ozone oxidation method, or a wet oxidation method with an oxidizing acid solution.

In some embodiments, a method for forming the initial doped polysilicon layer 32 includes: forming a second intrinsic amorphous silicon layer on the first tunneling layer 111 using a deposition process, for example, the second intrinsic amorphous silicon layer may be formed using a low-pressure chemical vapor deposition method or a plasma-enhanced chemical vapor deposition method. The second intrinsic amorphous silicon layer is then subjected to a doping process to inject a first doping element into the second intrinsic polysilicon layer, and the second intrinsic amorphous silicon layer is polycrystallized by a high temperature annealing process to form the initial doped polysilicon layer 32. In some embodiments, the second doping element may be doped in situ during depositing the second intrinsic amorphous silicon layer, the second doping element has a conductive type that is the same as that of the substrate 100, and the second doping element may be boron or phosphorus.

Figure 19:
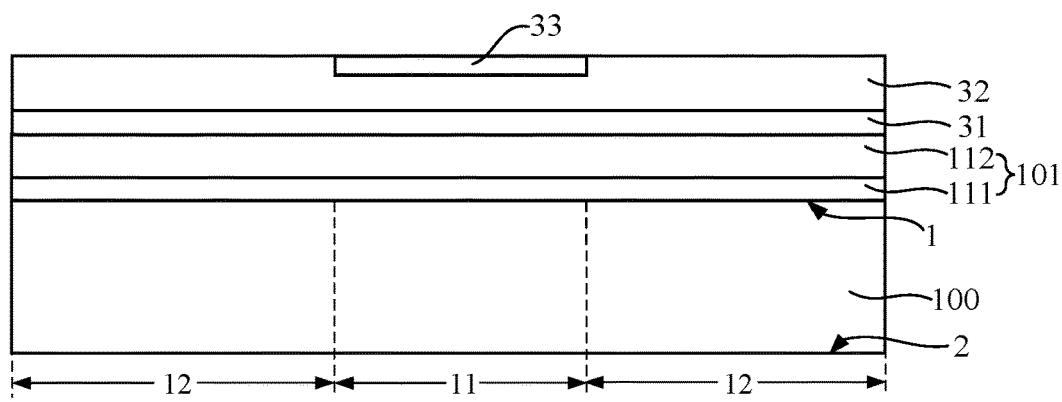
FIG. 19 is a schematic cross-sectional structural diagram corresponding to an operation of forming a modified layer in a method for preparing a solar cell according to an embodiment of the present disclosure.

Referring to FIG. 19, a laser process is performed on portions of the initial doped polysilicon layer 32 aligned with the first regions 11 to convert a partial thickness of the portions of the initial doped polysilicon layer 32 aligned with the first regions 11 into a modified layer 33.

Using the modified layer 33 as a mask, the initial doped polysilicon layer 32 as well as the initial tunneling layer 31 are subjected to an etching process to remove portions of the initial doped polysilicon layer 32 as well as the initial tunneling layer 31 aligned with the second regions 12, with remaining modified layer 33, initial doped polysilicon layer 32 as well as initial tunneling layer 31 constituting second passivation contact structures 102.

The modified layer 33 formed by the laser process has greater density, and an etching rate of the etching process performed on the modified layer 33 is less than an etching rate of the etching process performed on the initial doped polysilicon layer 32, and thus the modified layer 33 can be used as a mask by utilizing an etch selectivity of the modified layer 33 and the initial doped polysilicon layer 32. In the operation of etching the initial doped polysilicon layer 32 and the initial tunneling layer 31 aligned with the first regions 11 and the second regions 12, a portion of the modified layer 33 on the initial doped polysilicon layer 32 aligned with the first region 11 is used as a mask to etch away portions of the initial doped polysilicon layer 32 and the initial tunneling layer 31 aligned with the second regions 12, and portions of the initial doped polysilicon layer 32 and the initial tunneling layer 31 aligned with the first regions 11 are retained to form a doped polysilicon layer and the second tunneling layer 121.

Figure 20:
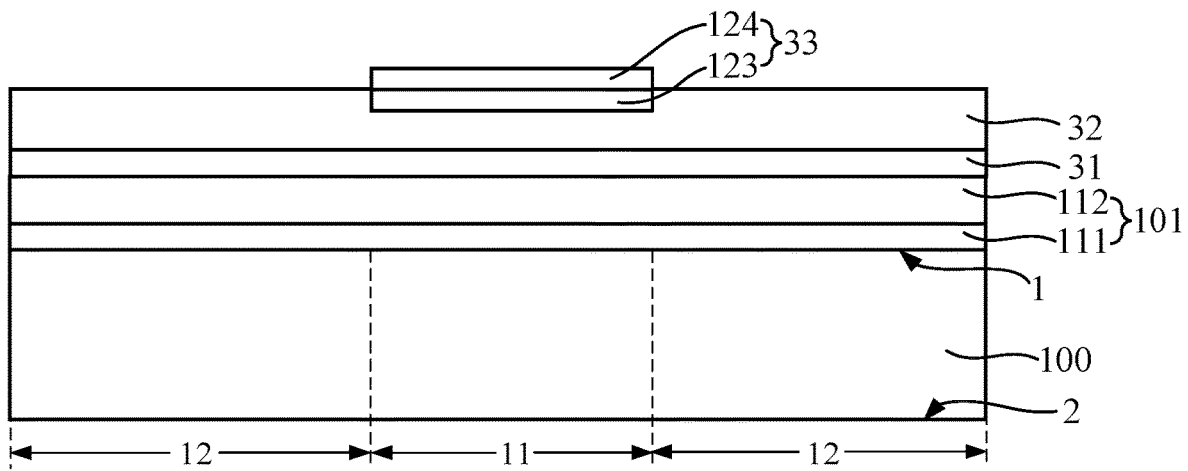
FIG. 20 is another schematic cross-sectional structural diagram corresponding to an operation of forming a modified layer in a method for preparing a solar cell according to an embodiment of the present disclosure.
Figure 21:
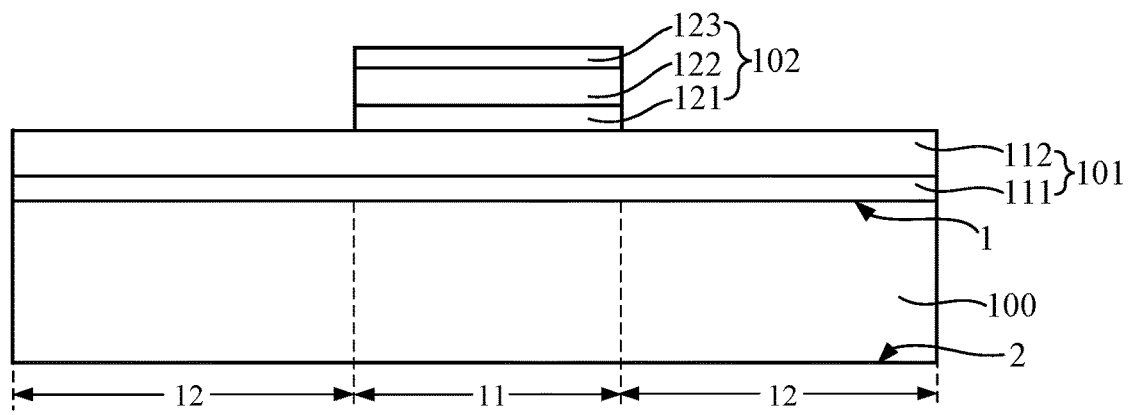
FIG. 21 is a schematic cross-sectional structural diagram corresponding to an operation of forming a second passivation contact structure in a method for preparing a solar cell according to an embodiment of the present disclosure.

Referring to FIG. 20, in some embodiments, the modified layer 33 includes an amorphous silicon layer 123 and a silicon oxide layer 124 stacked in a direction away from the substrate 100, and the silicon oxide layer 124 is removed in an etching process. An etching rate of the etching process performed on the amorphous silicon layer 123 is less than an etching rate of the etching process performed on the initial doped polysilicon layer 3 as well as an etching rate of the etching process performed the initial tunneling layer 31.

During performing the laser process on a surface of the initial doped polysilicon layer 32 facing away from the substrate 100, the laser process is performed on portions of the surface of the initial doped polysilicon layer 32 aligned with the first regions 11, the laser reaches a partial thickness of the initial doped polysilicon layer 32, and this partial thickness of the initial doped polysilicon layer 32 is locally heated and melted. After the laser stops irradiation, this partial thickness of the initial doped polysilicon layer 32 is cooled and solidified to form the amorphous silicon layer 123, and a silicon oxide layer 124 is formed on a surface of the amorphous silicon layer 123 in contact with air.

Since amorphous silicon is denser compared to polycrystalline silicon, the etching process is not easy to etch the amorphous silicon layer 123, allowing the amorphous silicon layer 123 to protect portions of the initial doped polysilicon layer 32 and the initial tunneling layer 31 aligned with the first regions 11.

In some embodiments, the etching process may be an alkali etching process using an alkali solution to soak the silicon oxide layer 124, the amorphous silicon layer 123, the initial doped polysilicon layer 32 and the initial tunneling layer 31, and the alkali solution reacts with portions of the initial doped polysilicon layer 32 and the initial tunneling layer 31 aligned with the second regions 12 to remove the portions of the initial doped polysilicon layer 32 and the initial tunneling layer 31 aligned with the second regions 12. Since the silicon oxide layer 124 as well as the amorphous silicon layer 123 reacts at a slower rate in the alkaline solution than the initial doped polysilicon layer 32 as well as the initial tunneling layer 31, so that portions of the initial doped polysilicon layer 32 and the initial tunneling layer 31 which are covered by the amorphous silicon layer 123 are not removed, and thus form a local passivation contact structure, i.e., the second passivation contact structure 102.

After the second passivation contact structure 102 is formed, the silicon oxide layer 124 is removed by a cleaning process, the amorphous silicon layer 123 is retained, and the amorphous silicon layer 123 is used to form the second passivation contact structure 102. The cleaning process may be a hydrofluoric acid solution etching method.

Referring to FIG. 2 and FIG. 3, first passivation films 103 are formed on the first passivation contact structure 101, and an orthographic projection of a respective first passivation film 103 on the first surface 1 is in a respective second region 12. First electrodes 104 are formed, each first electrode 104 extends in the second direction Y that is perpendicular to the first direction X, and the first electrode 104 covers a top surface of the second passivation contact structure 102 and at least part of two opposing sidewalls of the second passivation contact structure 102 to be in electrical contact with the second passivation contact structure 102.

The first electrode 104 covers the top surface and at least part of the two opposing sidewalls of the second passivation contact structure 102, which increases a contact area between the first electrode 104 and the second passivation contact structure 102 and enhances the electrical contact performance between the first electrode 104 and the second passivation contact structure 102, thereby facilitating the collection of carriers by the first electrode 104.

In some embodiments, a method for forming the first passivation films 103 as well as the first electrodes 104 includes the following operations.

Figure 22:
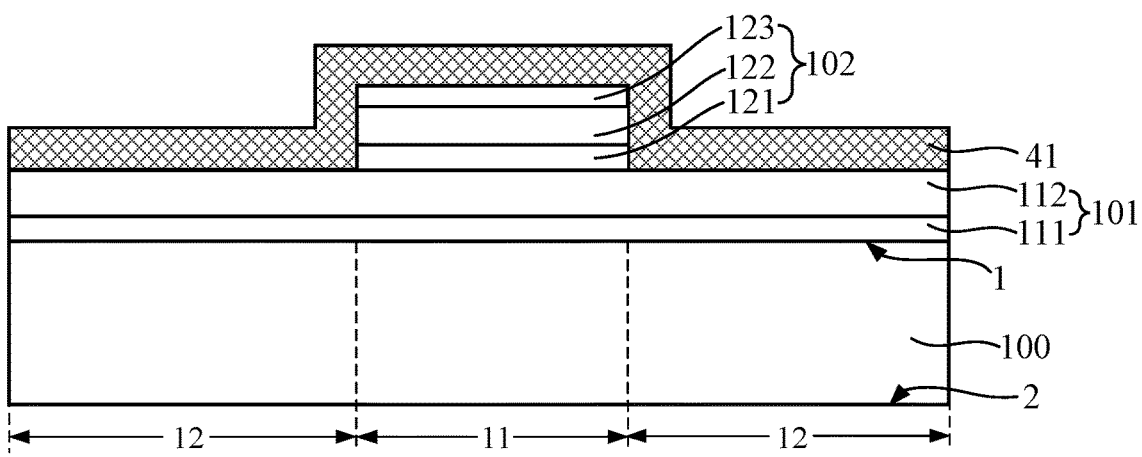
FIG. 22 is a schematic cross-sectional structural diagram corresponding to an operation of forming an initial first passivation film in a method for preparing a solar cell according to an embodiment of the present disclosure.

Referring to FIG. 22, forming an initial first passivation film 41, the initial first passivation film 41 includes first portions covering a portion of the top surface of the first passivation contact structure 101, second portions covering top and two opposing sidewalls of the second passivation contact structures 102, each first portion is adjacent to a respective second portion.

In other words, a width of the second portion is larger than a width of the second passivation contact structure 102 in the first direction X.

The initial first passivation film 41 is a continuous film layer, and in embodiments of the present disclosure, the initial first passivation film 41 is notated as the first portions as well as the second portions only for the purpose of dividing the different positions of the initial first passivation film 41.

In some embodiments, the initial first passivation film 41 may be formed by any of plasma enhanced chemical vapor deposition, atomic layer deposition, or physical vapor deposition. The initial first passivation film 41 may be a single-layer structure or a multilayer structure. In some embodiments, a material of the initial first passivation film 41 includes at least one of silicon oxide, aluminum oxide, silicon nitride, or silicon nitride oxide.

After forming the initial first passivation film 41, the conductive paste is formed on top surfaces of the second portions. That is, the conductive paste covers top surfaces of portions of the initial first passivation film 41 formed on the top surface as well as two opposing sidewalls of the second passivation contact structure 102.

In some embodiments, the conductive paste may be covered on the top surfaces of the second portions by any one of screen printing, inkjet printing, laser transfer printing, or the like, and the conductive paste may include a metal material, which may be any one of silver, gold, aluminum, copper, and nickel.

Afterwards, the conductive paste is subjected to a sintering process to form the first electrode 104, as shown in FIG. 2 as well as FIG. 3. The first electrode 104 penetrates the whole second portion disposed on the top surface of the second passivation contact structure 102 to contact the top surface of the second passivation contact structure 102, and the first electrode 104 also penetrates at least part of the second portion disposed on the two opposing sidewall of the second passivation contact structure 102 to contact at least part of the two opposing sidewall of the second passivation contact structure 102, and remaining initial first passivation film 41 constitutes the first passivation film 103. The conductive paste has a material with a highly corrosive component such as glass, such that the corrosive component corrodes the initial first passivation film 41 during the sintering process make the conductive paste permeate the initial first passivation film 41.

In some embodiments, during the sintering process, metal components in the conductive slurry also undergo grain regrowth and recrystallization to form conductive extensions, which may extend into the first passivation contact structure 101 or only into the second passivation contact structure 102 to collect carriers.

In some embodiments, the solar cell is a TOPCON cell, the method for preparing the solar cell further includes the following operations.

Referring to FIG. 14 and FIG. 15, the substrate 100 is diffused from the second surface 2 of the substrate 100 to form an emitter 105 within the substrate 100, a doping element type of the emitter 105 is different from a doping element type of the substrate 100 and thus forming a PN junction with the substrate 100.

In some embodiments, the operation of forming the emitter 105 may precede the operation of forming the first passivation contact structure 101.

In some embodiments, the method for preparing the solar cell further includes forming a second passivation layer 106 on the emitter 105, and the second passivation layer 106 may be a single-layer structure or a multilayer structure. In some embodiments, a material of the second passivation layer 106 includes at least one of silicon oxide, aluminum oxide, silicon nitride, or silicon nitride oxide.

The process for forming the second passivation layer 106 can be referred to the above description of the process for forming the initial first passivation film 41 and is not repeated below.

In some embodiments, the method for preparing the solar cell further includes forming second electrodes 107 penetrating the second passivation layer 106 to be in electrical contact with the emitter 105. In some embodiments, the process of forming the second electrodes 107 may be the same as the process of forming the first electrodes 104, and reference may be made to the above description of the method for forming the first electrodes 104.

Figure 23:
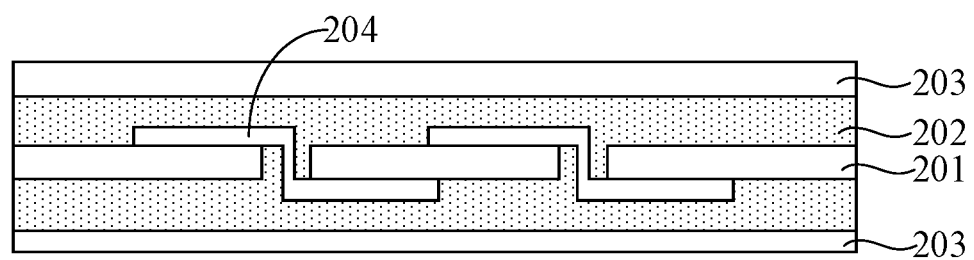
FIG. 23 is a schematic structural diagram of a photovoltaic module according to an embodiment of the present disclosure.

Some embodiments of the present disclosure further provide a photovoltaic module, as shown in FIG. 23. The photovoltaic module includes at least one cell string formed by connecting a plurality of solar cells 201 provided in the above embodiments, at least one encapsulation layer 202 each configured to cover a surface of a cell string, and at least one cover plate 203 each configured to cover a surface of an encapsulation layer 202 facing away from the cell string. The solar cells 201 are electrically connected in the form of a whole piece or a plurality of pieces to form a plurality of cell strings, and the plurality of cell strings are electrically connected in series and/or in parallel.

Specifically, in some embodiments, the plurality of cell strings may be electrically connected to each other by conductive tapes 204. The encapsulation layer 202 covers the first surface 1 and the second surface of the solar cell 201, and specifically, the encapsulation layer 202 may be an ethylene vinyl acetate copolymer (EVA) adhesive film, a polyethylene octene co-elastomer (POE) adhesive film, or an organic encapsulation adhesive film such as a polyethylene terephthalate (PET) adhesive film or polyvinyl butyral butyrate (PVB). In some embodiments, the cover plate 203 may be a cover plate having a light-transmitting function such as a glass cover plate, a plastic cover plate, or the like. Specifically, a surface of the cover plate 203 toward the encapsulation layer 202 may be a concave-convex surface, thereby increasing the utilization rate of incident light.

Although the present disclosure is disclosed in the above embodiments, and the above embodiments are not intended to limit the claims. A person skilled in the art may make several possible variations and modifications without departing from the concept of the present disclosure, and therefore, the protection scope of the present disclosure shall be subject to the scope defined by the claims of the present disclosure.

Any person of ordinary skill in the art can understand that the above embodiments are specific embodiments for realizing the present disclosure. In practical application, various changes may be made thereto in form and details without departing from the scope of the present disclosure. Any person skilled in the art may make various changes and modifications without departing from the scope of the present disclosure, and therefore the protection scope of the present disclosure shall be subject to the scope defined in the claims.

What is claimed is:

1. A solar cell, comprising:
a substrate having a first surface, wherein the first surface includes first regions and second regions alternatingly arranged in a first direction parallel to the first surface;
a first passivation contact structure formed on the first regions and the second regions;
second passivation contact structures formed on the first passivation contact structure, the second passivation contact structures including at least one respective second passivation contact structure corresponding to a respective first region of the first regions, wherein an orthographic projection of each of the at least one respective second passivation contact structure on the first surface is in the respective first region;
first passivation films formed on the first passivation contact structure, wherein an orthographic projection of each of the first passivation films on the first surface is in a respective one of the second regions; and
first electrodes extending in a second direction perpendicular to the first direction, wherein the first electrodes include a respective first electrode formed over the at least one respective second passivation contact structure, the respective first electrode covers a top surface and at least part of two opposing sidewalls of each of the at least one respective second passivation contact structure in the first direction, and is in electrical contact with the at least one respective second passivation contact structure.

2. The solar cell according to claim 1, wherein the respective first electrode includes a plurality of conductive extensions, and the plurality of conductive extensions include:
first conductive extensions, wherein the first conductive extensions penetrate each of the at least one respective second passivation contact structure to extend into the first passivation contact structure; and
second conductive extensions extending into each of the at least one respective second passivation contact structure.

3. The solar cell according to claim 2, wherein the first passivation contact structure includes a first tunneling layer and a first doped conductive layer stacked in a direction away from the substrate, and the first conductive extensions extend into a partial thickness of the first doped conductive layer.

4. The solar cell according to claim 2, wherein the second conductive extensions include:
first conductive sub-extensions extending into each of the at least one respective second passivation contact structure from the top surface of each of the at least one respective second passivation contact structure;
second conductive sub-extensions extending into each of the at least one respective second passivation contact structure from the two opposing sidewalls of each of the at least one respective second passivation contact structure.

5. The solar cell according to claim 4, wherein each of the at least one respective second passivation contact structure includes a second tunneling layer, a second doped conductive layer and an amorphous silicon layer stacked in a direction away from the substrate, and wherein the first conductive sub-extensions include:
a first plurality of first conductive sub-extensions extending into the amorphous silicon layer; and
a second plurality of first conductive sub-extensions extending into the second doped conductive layer.

6. The solar cell according to claim 2, wherein the respective first electrode further includes:
a glass frit layer covering the top surface and the at least part of two opposing sidewalls of each of the at least one respective second passivation contact structure, wherein the plurality of conductive extensions are formed in the glass frit layer and extend from the glass frit layer to each of the at least one respective second passivation contact structure; and
a slurry body layer formed on the glass frit layer, wherein the slurry body layer includes a material of the plurality of conductive extensions.

7. The solar cell according to claim 1, wherein the respective first electrode covers two opposing sidewalls of each of the at least one respective second passivation contact structure in the first direction and a portion of a top surface of the first passivation contact structure, and the first passivation films include a respective first passivation film having a sidewall facing the at least one respective second passivation contact structure and in contact with a portion of the respective first electrode formed on the two opposing sidewalls of each of the at least one respective second passivation contact structure.

8. The solar cell according to claim 7, wherein the respective first electrode includes a plurality of conductive extensions, and the plurality of conductive extensions include:
third conductive extensions, wherein the third conductive extensions extend from the top surface of the first passivation contact structure into a partial thickness of the first passivation contact structure to be in electrical contact with the first passivation contact structure.

9. The solar cell according to claim 1, wherein the respective first electrode covers a part of two opposing sidewalls of each of the at least one respective second passivation contact structure, and a portion of the respective first electrode covering the part of two opposing sidewalls of each of the at least one respective second passivation contact structure is formed between two adjacent first passivation films.

10. The solar cell according to claim 1, wherein the first passivation contact structure includes a first tunneling layer and a first doped conductive layer stacked in a direction away from the substrate, and each of the at least one respective second passivation contact structure includes a second tunneling layer, a second doped conductive layer, and an amorphous silicon layer stacked in the direction away from the substrate; and wherein the first doped conductive layer has a thickness that is less than a thickness of the second doped conductive layer.

11. The solar cell according to claim 10, wherein the first doped conductive layer has a material including at least one of amorphous silicon, polysilicon, and silicon carbide, and the second doped conductive layer has a material including at least one of amorphous silicon, polysilicon, and silicon carbide.

12. The solar cell according to claim 1, wherein the second passivation contact structures are arranged at intervals in the first direction, and each of the second passivation contact structures extends in the second direction.

13. The solar cell according to claim 1, wherein the second passivation contact structures are arranged at intervals in both the first direction and the second direction.

14. A method for preparing a solar cell, comprising:
providing a substrate having a first surface, wherein the first surface includes first regions and second regions alternatingly arranged in a first direction parallel to the first surface;
forming a first passivation contact structure on the first regions and the second regions;
forming second passivation contact structures on the first passivation contact structure, the second passivation contact structures including at least one respective second passivation contact structure corresponding to a respective first region of the first regions, wherein an orthographic projection of each of the at least one respective second passivation contact structure on the first surface is in the respective first region;
forming first passivation films on the first passivation contact structure, wherein an orthographic projection of each of the first passivation films on the first surface is in a respective one of the second regions; and
forming first electrodes extending in a second direction perpendicular to the first direction, wherein the first electrodes include a respective first electrode formed over the at least one respective second passivation contact structure, the respective first electrode covers a top surface and at least part of two opposing sidewalls of each of the at least one respective second passivation contact structure in the first direction, and is in electrical contact with the at least one respective second passivation contact structure.

15. A photovoltaic module, comprising:
at least one cell string each formed by connecting a plurality of solar cells;
at least one encapsulation layer each configured to cover a surface of a respective cell string; and
at least one cover plate each configured to cover a surface of a respective encapsulating adhesive film facing away from the respective cell string;
wherein each of the plurality of solar cells includes:
a substrate having a first surface, wherein the first surface includes first regions and second regions alternatingly arranged in a first direction parallel to the first surface;
a first passivation contact structure formed on the first regions and the second regions;
second passivation contact structures formed on the first passivation contact structure, the second passivation contact structures including at least one respective second passivation contact structure corresponding to a respective first region of the first regions, wherein an orthographic projection of each of the at least one respective second passivation contact structure on the first surface is in the respective first region;
first passivation films formed on the first passivation contact structure, wherein an orthographic projection of each of the first passivation films on the first surface is in a respective one of the second regions; and
first electrodes extending in a second direction perpendicular to the first direction, wherein the first electrodes include a respective first electrode formed over the at least one respective second passivation contact structure, the respective first electrode covers a top surface and at least part of two opposing sidewalls of each of the at least one respective second passivation contact structure in the first direction, and is in electrical contact with the at least one respective second passivation contact structure.

16. The photovoltaic module according to claim 15, wherein the respective first electrode includes a plurality of conductive extensions, and the plurality of conductive extensions include:
first conductive extensions, wherein the first conductive extensions penetrate each of the at least one respective second passivation contact structure to extend into the first passivation contact structure; and
second conductive extensions extending into each of the at least one respective second passivation contact structure.

17. The photovoltaic module according to claim 16, wherein the first passivation contact structure includes a first tunneling layer and a first doped conductive layer stacked in a direction away from the substrate, and the first conductive extensions extend into a partial thickness of the first doped conductive layer.

18. The photovoltaic module according to claim 16, wherein the second conductive extensions include:
first conductive sub-extensions extending into each of the at least one respective second passivation contact structure from the top surface of each of the at least one respective second passivation contact structure;
second conductive sub-extensions extending into each of the at least one respective second passivation contact structure from the two opposing sidewalls of each of the at least one respective second passivation contact structure.

19. The photovoltaic module according to claim 18, wherein each of the at least one respective second passivation contact structure includes a second tunneling layer, a second doped conductive layer and an amorphous silicon layer stacked in a direction away from the substrate, and wherein the first conductive sub-extensions include:
a first plurality of first conductive sub-extensions extending into the amorphous silicon layer; and
a second plurality of first conductive sub-extensions extending into the second doped conductive layer.

20. The photovoltaic module according to claim 16, wherein the respective first electrode further includes:
a glass frit layer covering the top surface and the at least part of two opposing sidewalls of each of the at least one respective second passivation contact structure, wherein the plurality of conductive extensions are formed in the glass frit layer and extend from the glass frit layer to each of the at least one respective second passivation contact structure; and
a slurry body layer formed on the glass frit layer, wherein the slurry body layer includes a material of the plurality of conductive extensions.

* * * * *